(12) United States Patent
Wang et al.

(10) Patent No.: US 12,127,457 B2
(45) Date of Patent: Oct. 22, 2024

(54) DISPLAY SUBSTRATE AND DISPLAY APPARATUS

(71) Applicant: BOE TECHNOLOGY GROUP CO., LTD., Beijing (CN)

(72) Inventors: Bo Wang, Beijing (CN); Fuqiang Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 618 days.

(21) Appl. No.: 17/284,815

(22) PCT Filed: May 12, 2020

(86) PCT No.: PCT/CN2020/089723
§ 371 (c)(1),
(2) Date: Apr. 13, 2021

(87) PCT Pub. No.: WO2021/226817
PCT Pub. Date: Nov. 18, 2021

(65) Prior Publication Data
US 2022/0130943 A1 Apr. 28, 2022

(51) Int. Cl.
*H10K 59/131* (2023.01)
*H10K 59/126* (2023.01)

(52) U.S. Cl.
CPC ....... *H10K 59/1315* (2023.02); *H10K 59/126* (2023.02)

(58) Field of Classification Search
CPC .... H10K 59/10–1315; H10K 59/60–65; G09F 9/33; H01L 27/12
See application file for complete search history.

(56) References Cited

U.S. PATENT DOCUMENTS 10,756,136 B1 * 8/2020 Ma .......................... H01L 31/147
2019/0324580 A1 * 10/2019 Tanaka ................. H10K 50/171
(Continued)

FOREIGN PATENT DOCUMENTS

| CN | 110047897 | 7/2019 |
| CN | 110276312 | 9/2019 |

(Continued)

OTHER PUBLICATIONS

Extended European Search Report for EP Application No. 20900709.5, dated Jul. 12, 2023, 10 pages.

(Continued)

*Primary Examiner* — Roberto W Flores
(74) *Attorney, Agent, or Firm* — Dority & Manning, P.A.

(57) ABSTRACT

A display substrate includes a base substrate, a first light-shielding layer, a plurality of first sub-pixels and a first power line. The first light-shielding layer is disposed on a side of the base substrate, the first light-shielding layer is located at least in a first display area, and has a plurality of openings arranged in an array. The first sub-pixels are disposed at a side of the first light-shielding layer away from the base substrate and are located in the first display area, and orthogonal projections of the first sub-pixels on the base substrate are non-overlapping with orthogonal projections of the openings on the base substrate. The first power line includes a first power bus and a plurality of first power sub-lines, and the first light-shielding layer is electrically connected to the first power line.

16 Claims, 13 Drawing Sheets

(56) References Cited

U.S. PATENT DOCUMENTS

| | | | |
|---|---|---|---|
| 2020/0126472 A1 | 4/2020 | Tang et al. | |
| 2020/0161399 A1* | 5/2020 | Park | H10K 59/126 |
| 2020/0176550 A1* | 6/2020 | Youn | H10K 59/1315 |
| 2020/0203468 A1* | 6/2020 | Zeng | H10K 59/65 |
| 2021/0202621 A1 | 7/2021 | Liang et al. | |

FOREIGN PATENT DOCUMENTS

| | | |
|---|---|---|
| CN | 110890412 | 3/2020 |
| EP | 3751620 A1 | 12/2020 |
| KR | 20170024182 | 3/2017 |

OTHER PUBLICATIONS

PCT International Search Report for corresponding PCT Application No. PCT/CN2020/089723, 11 pages.

* cited by examiner

DISPLAY SUBSTRATE AND DISPLAY APPARATUS

CROSS-REFERENCE TO RELATED APPLICATIONS

This application is a national phase entry under 35 USC 371 of International Patent Application No. PCT/CN2020/089723, filed on May 12, 2020, which is incorporated herein by reference in its entirety.

TECHNICAL FIELD

The present disclosure relates to the field of display technologies, and in particular, to a display substrate and a display apparatus.

BACKGROUND

In structural design of display apparatuses (such as mobile phones, tablet computers, wearable display products and other terminal products), a screen-to-body ratio, i.e., a ratio of a display area of a display apparatus to an entire front surface of the display apparatus, is an important design parameter.

With the development of display technologies, display apparatuses are increasingly developing toward a direction of a super large screen-to-body ratio, and even full-screen display (that is, an area of the display area is equal to or very close to an area of the entire front surface of the display apparatus). Therefore, how to increase the screen-to-body ratio of the display apparatus has become a hot topic of research for those skilled in the art.

To ensure normal operation of some devices such as a front camera unit, a light sensor, a distance sensor or a biosensor in the display apparatus, the devices need be arranged toward a front side of the display apparatus. For example, a lens of the front camera unit is arranged toward the front side of the display apparatus, and sensing surfaces of the sensors are arranged toward the front side of the display apparatus, etc., so that the devices can collect information in the environment, and then perform corresponding operations, e.g., collecting images of a person or an object at the front side of the display apparatus, or collecting light at the front side of the display apparatus, etc.

SUMMARY

In one aspect, a display substrate is provided, and the display substrate has a display area and a peripheral area surrounding the display area. The display area includes a first display area. The display substrate includes a base substrate, a first light-shielding layer, a plurality of first sub-pixels and a first power line.

The first light-shielding layer is disposed on a side of the base substrate, the first light-shielding layer is located at least in the first display area, and having a plurality of openings arranged in an array. The plurality of first sub-pixels are disposed at a side of the first light-shielding layer away from the base substrate, the plurality of first sub-pixels are located in the first display area, and orthogonal projections of the plurality of first sub-pixels on the base substrate are non-overlapping with orthogonal projections of the openings on the base substrate. The first power line includes a first power bus and a plurality of first power sub-lines. At least one portion of the first power bus is located in a region of the peripheral area proximate to a side of the first display area. The plurality of first power sub-lines are located in the first display area and are electrically connected to the first power bus. The plurality of first power sub-lines are configured to provide first power signals to the plurality of first sub-pixels, and orthogonal projections of the plurality of first power sub-lines on the base substrate are non-overlapping with the orthogonal projections of the openings on the base substrate. The first light-shielding layer is electrically connected to the first power line.

In some embodiments, the display substrate further includes at least one insulating film disposed between the first power line and the first light-shielding layer, and the at least one insulating film being provided with a plurality of via holes extending through the at least one insulating film. The first power line is electrically connected to the first light-shielding layer through the plurality of via holes.

In some embodiments, the first light-shielding layer is also located in the peripheral area, the plurality of via holes includes a plurality of first via holes located in the peripheral area, and the first light-shielding layer is electrically connected to the first power bus through the plurality of first via holes.

In some embodiments, the plurality of first via holes include at least two types of first via holes having different hole depths.

In some embodiments, the plurality of first via holes include at least one first via hole group, and each first via hole group includes at least one first via column. Hole depths of first via holes in each first via hole column are different.

In some embodiments, there are a plurality of first via hole groups, and there are a plurality of first via hole columns in each first via hole group. The plurality of first via hole groups are arranged in a first direction. The plurality of first via hole columns in each first via hole group are arranged in the first direction, and first via holes having a same hole depth in the plurality of first via hole columns are arranged in a row in the first direction.

In some embodiments, the plurality of via holes further includes a plurality of second via holes located in the first display area, and the first light-shielding layer is electrically connected to at least part of the plurality of first power sub-lines through the plurality of second via holes.

In some embodiments, the plurality of second via holes are evenly distributed in the first display area.

In some embodiments, one pixel is provided at a position among every four openings of the first light-shielding layer, the pixel includes three first sub-pixels, and one pixel corresponds to at least one second via hole.

In some embodiments, the at least one insulating film includes a first insulating layer located between the first light-shielding layer and the plurality of first sub-pixels, a first gate insulating layer, a second gate insulating layer and an interlayer insulating layer. At least one first sub-pixel of the plurality of first sub-pixels includes thin film transistors and a storage capacitor.

The thin film transistor includes: an active layer located on the first insulating layer, the first gate insulating layer being located on a side of the active layer away from the base substrate; a gate located on a side of the first gate insulating layer away from the base substrate, the second gate insulating layer being located on a side of the gate away from the base substrate, the interlayer insulating layer being located on a side of the second gate insulating layer away from the base substrate; and a source and a drain located on a side of the interlayer insulating layer away from the base substrate.

The storage capacitor includes a first electrode plate and a second electrode plate, the first electrode plate and the gate are located in a same layer, and the second electrode plate is located between the second gate insulating layer and the interlayer insulating layer.

In some embodiments, the first power bus includes a first sub-layer and a second sub-layer, and the first sub-layer is electrically connected to the second sub-layer through a third via hole.

In some embodiments, at least one first power sub-line of the plurality of first power sub-lines includes a third sub-layer and a fourth sub-layer, and the third sub-layer is electrically connected to the fourth sub-layer through a fourth via hole.

In some embodiments, the display area further includes a second display area located on a side of the first display area away from the first power bus. The display substrate further includes: a plurality of second sub-pixels and a second power line. The plurality of second sub-pixels are located in the second display area. The second power line includes a second power bus and a plurality of second power sub-lines. At least one portion of the second power bus is located in a region of the peripheral area proximate to a side of the second display area, the plurality of second power sub-lines are located in the second display area and are electrically connected to the second power bus, and the plurality of second power sub-lines are configured to provide second power signals to the plurality of second sub-pixels.

In some embodiments, an area of each first sub-pixel in the first display area is greater than an area of each second sub-pixel in the second display area.

In some embodiments, in the first display area and the second display area, each sub-pixel has at least one sub-pixel opening, and a distance between sub-pixel openings of any two adjacent sub-pixels that emit light with a same color in a first direction is equal.

In some embodiments, a surface of the first light-shielding layer away from the base substrate has depressions corresponding to at least part of the plurality of first via holes, and the depressions have at least two types of depths.

In some embodiments, the first power signal is the same as the second power signal, or the first power signal is different from the second power signal.

In some embodiments, the first power signal is less than the second power signal in a case where the first power signal is different from the second power signal.

In some embodiments, a distribution density of the plurality of second sub-pixels is greater than a distribution density of the plurality of first sub-pixels.

In some embodiments, the display substrate further includes a second light-shielding layer disposed on a side of the base substrate, the second light-shielding layer is located in the second display area, and the second light-shielding layer and the first light-shielding layer are located in a same layer. The second light-shielding layer is electrically connected to the second power line.

In another aspect, a display apparatus is provided. The display apparatus includes the display substrate as described above, and a front optical component disposed on a side of the display substrate away from a display surface thereof. An orthogonal projection of the front optical component on the display substrate is located in the first display area.

In some embodiments of the present disclosure, the front optical component includes an infrared detection unit.

BRIEF DESCRIPTION OF THE DRAWINGS

In order to describe technical solutions in the present disclosure more clearly, accompanying drawings to be used in the description of some embodiments of the present disclosure will be introduced briefly below. Obviously, the accompanying drawings to be described below are merely accompanying drawings of some embodiments of the present disclosure, and a person of ordinary skill in the art can obtain other drawings according to those drawings. In addition, the accompanying drawings to be described below may be regarded as schematic diagrams, and are not limitations on actual sizes of products, actual processes of methods and actual timings of signals involved in the embodiments of the present disclosure.

DETAILED DESCRIPTION

Figure 1:
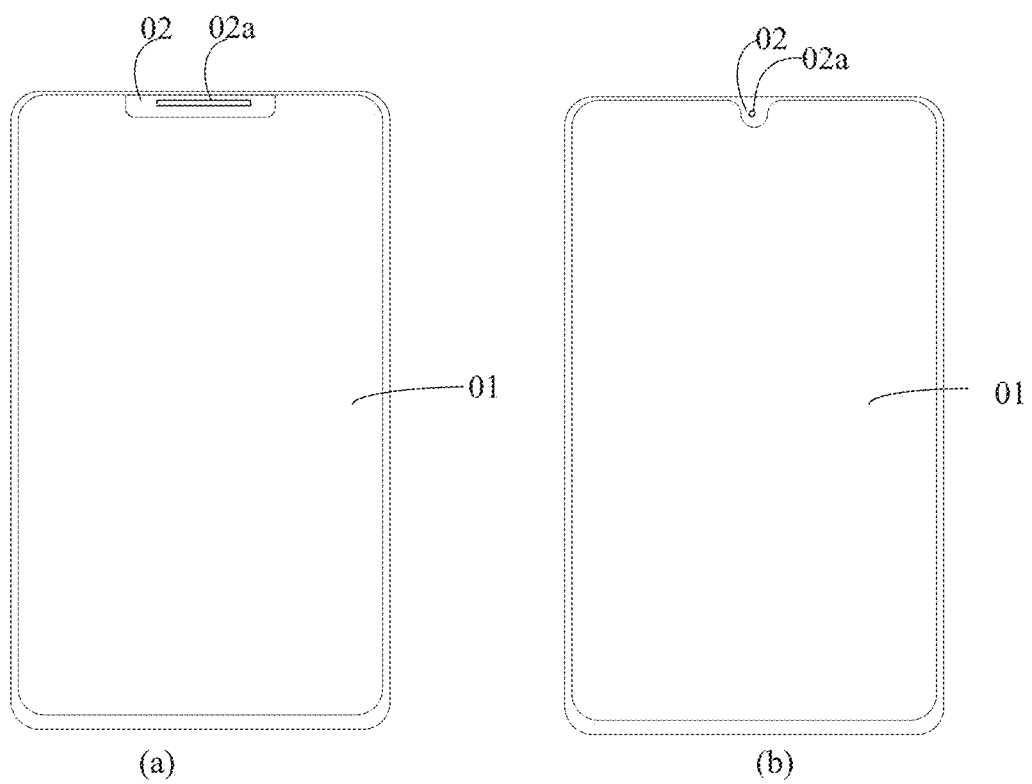
FIG. 1 is a structural diagram illustrating two kinds of display apparatuses in the related art.

Technical solutions in some embodiments of the present disclosure will be described clearly and completely below with reference to the drawings. Obviously, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, term "comprise" and other forms thereof such as the third-person singular form "comprises" and the present participle form "comprising" throughout the description and the claims are construed as open and inclusive meaning, i.e., "included, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Terms such as "first" and "second" are only used for descriptive purposes, and are not to be construed as indicating or implying the relative importance or implicitly indicating the number of indicated technical features below. Thus, features defined with "first" and "second" may explicitly or implicitly include one or more of the features. In the description of the embodiments of the present disclosure, term "a/the plurality of" means two or more unless otherwise specified.

In the description of some embodiments, terms such as "coupled", "connected" and their extensions may be used. For example, terms "connected" and "connected in series" may be used in the description of some embodiments to indicate that two or more components are in direct physical or electrical contact with each other. For another example, term "coupled" may be used in the description of some embodiments to indicate that two or more components are in direct physical or electrical contact. However, term "coupled" or "communicatively coupled" may also mean that two or more components are not in direct contact with each other, but still cooperate or interact with each other. The embodiments disclosed herein are not necessarily limited to the contents herein.

The phrase "at least one of A, B, and C" has a same meaning as the phrase "at least one of A, B, or C", and both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

Orientations or positional relationships indicated by terms "up/above", "down/below", "row/row direction", "column/column direction" and the like are based on the orientations or positional relationships shown in the accompanying drawings, and are merely for convenience of explanation of the technical solution of the present disclosure, and are not intended to indicate or imply that a referred device or component must have a particular orientation, and must be constructed and operated in a particular orientation. Therefore, they cannot be construed as limitations to the present disclosure.

For example, in some cases, embodiments involving "row direction" may be implemented in a case of "column direction", and vice versa. It is also within the scope of the claims to be protected by the present disclosure to rotate or mirror the solution of the present disclosure by 90°.

In the related art, as shown in part (a) of FIG. 1, in an example where a display apparatus is a mobile phone, a front surface (that is, a surface on which images are displayed) of the mobile phone includes a display area 01 and a non-display area 02 located on a periphery of the display area 01. A portion of the non-display area 02 is provided with device(s) 02a (e.g., one or more of a front camera unit, a light sensor, a distance sensor and a biosensor) therein, and a remaining portion of the non-display area 02 is not provided with the device(s) 02a therein. These portions cannot display images, thereby resulting in a relatively low screen-to-body ratio.

With the advent of technologies such as special-shaped cutting, in the related art, it is proposed that a shape of a display area may be changed from a conventional rectangle to a rectangle having a notch, so that a ratio of the display area to an entire front surface of a display apparatus is increased by providing the device(s) in a non-display area disposed on the outside of the notch.

With continued reference to FIG. 1, as shown in part (b) of FIG. 1, in an example where the display apparatus is a mobile phone, a hole is punched in a display panel by means of the special-shaped cutting technology. That is, a notch is formed in a portion of an edge of a display area 01, so that in a front surface of the mobile phone, a region where the device(s) 02a need to be arranged is a non-display area 02, and the other region is the display area 01. Therefore, the screen-to-body ratio of the display apparatus is increased to some extent.

However, the region disposed on the outside of the notch is still the non-display area and still reduces the screen-to-body ratio to a certain extent. Therefore, there is still the non-display area 02 in the front surface of the display apparatus, which affects the screen-to-body ratio of the display apparatus.

Figure 2:
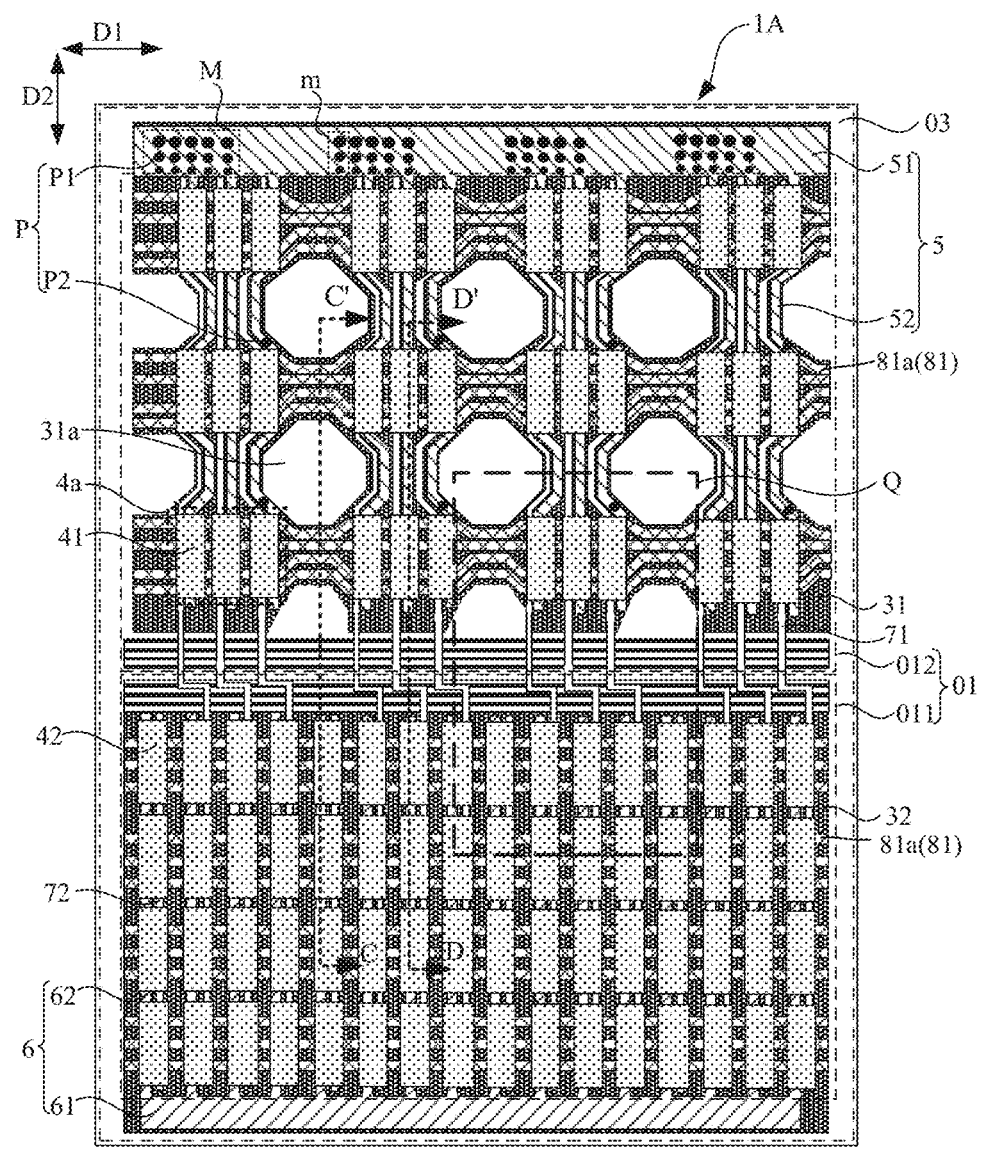
FIG. 2 is a structural diagram of a display substrate, in accordance with some embodiments of the present disclosure.

Embodiments of the present disclosure provide a display substrate 1A. As shown in FIGS. 2 to 4, the display substrate 1A has a display area 01 and a peripheral area 03 surrounding the display area 01, and the display area 01 includes a first display area 012 and a second display area 011.

For example, as shown in FIG. 2, the first display area 012 is arranged near an edge of the display substrate 1A, and has a shape matched with the edge.

Figure 3A:
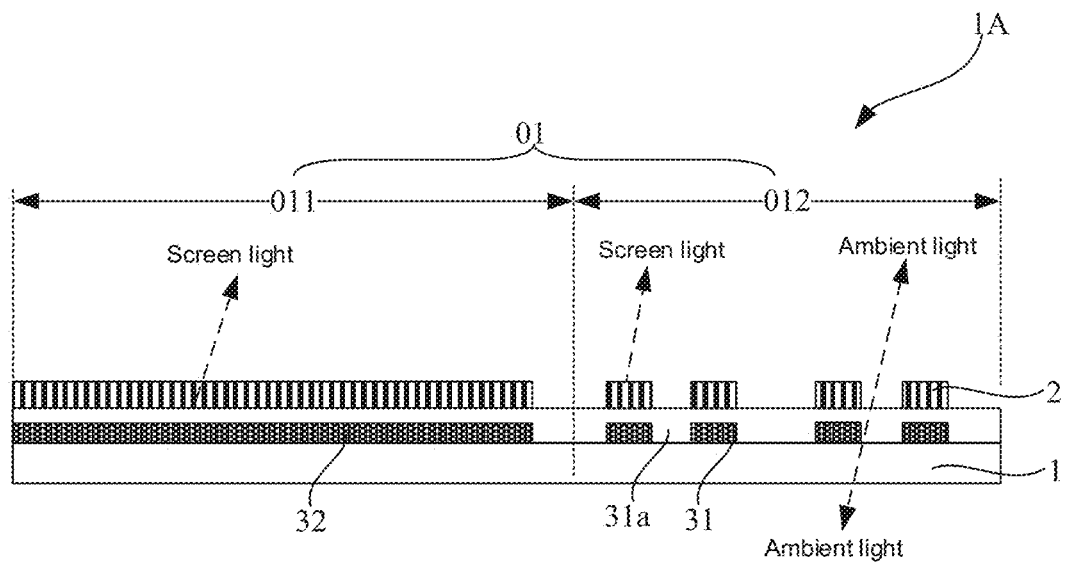
FIG. 3A is a sectional view of the display substrate shown in FIG. 2 taken along the section line CC'.

With continued reference to FIGS. 2, 3A and 38, the display substrate 1A includes a base substrate 1, a first light-shielding layer 31, a plurality of first sub-pixels 41 and a first power line 5. It will be noted that in FIGS. 3A and 3B, for convenience of understanding, sectional patterns of structures including the plurality of first sub-pixels 41 and their corresponding signal lines (including the first power line 5) that are disposed at a side of the first light-shielding layer 31 away from the base substrate 1 are combined into one body, which is illustrated as a portion of a display layer 2.

The first light-shielding layer 31 is disposed on a side of the base substrate 1 and is located at least in the first display area 012, and the first light-shielding layer 31 has a plurality of openings 31a arranged in an array.

The plurality of first sub-pixels 41 are disposed at the side of the first light-shielding layer 31 away from the base substrate 1, and are located in the first display area 012. Orthogonal projections of the plurality of first sub-pixels 41 on the base substrate do not overlap with orthogonal projections of the openings 31a on the base substrate. That is, the orthogonal projections of the plurality of first sub-pixels 41 on the base substrate 1 are located within an orthogonal projection of a portion, where the plurality of openings 31a are excluded, of the first light-shielding layer 31 on the base substrate 1.

Figure 3B:
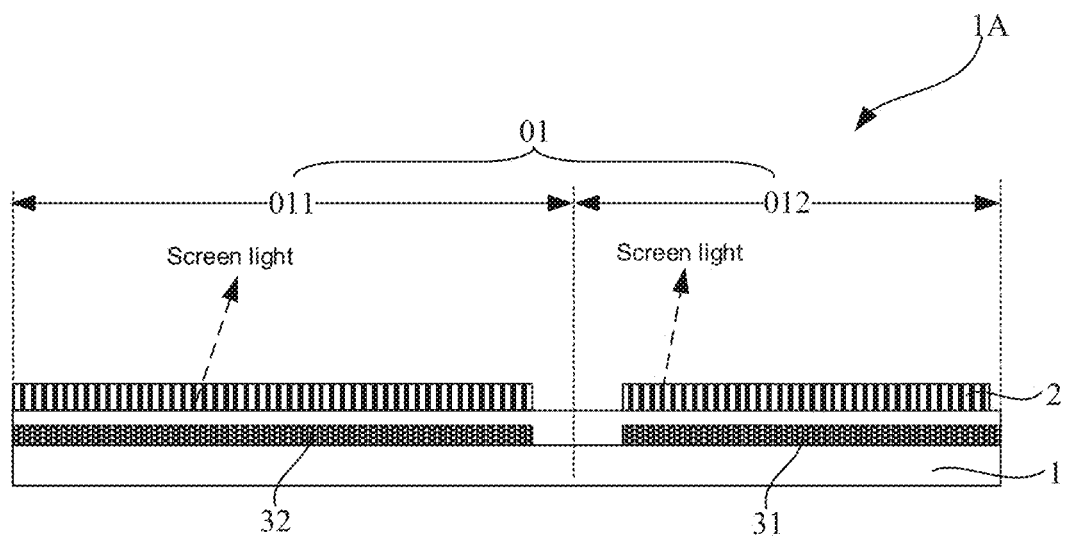
FIG. 3B is a sectional view of the display substrate shown in FIG. 2 taken along the section line DD'.
Figure 4:
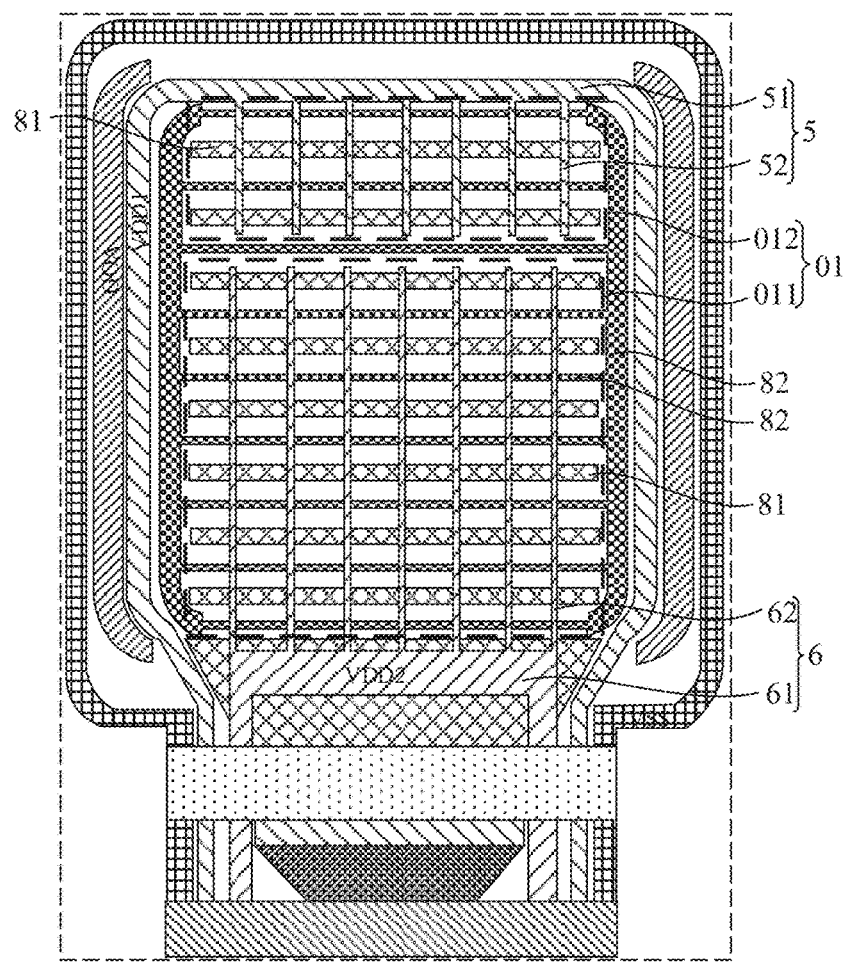
FIG. 4 is a wiring diagram of a display substrate, in accordance with some embodiments of the present disclosure.

With continued reference to FIGS. 2 to 3B, in the display substrate 1A, the first light-shielding layer 31 is configured to shield ambient light and prevent the ambient light from passing through the display substrate 1A in a region other than the plurality of openings 31a of the first light-shielding layer 31, while at the plurality of openings 31a of the first light-shielding layer 31, ambient light may enter from one side of the display substrate 1A, pass through the display substrate 1A, and exit from the other side of the display substrate 1A. The ambient light includes invisible light, such as infrared light. For example, a propagation path of the ambient light is shown by a dotted line with arrows in FIG. 3A. Here, the two sides of the display substrate 1A refer to opposite sides of the display substrate 1A in a direction perpendicular to the base substrate 1.

In addition, the first light-shielding layer 31 is also configured to shield the light (i.e., screen light) emitted by light-emitting devices of the display substrate 1A. That is, the light emitted by the light-emitting devices can travel towards a side of the first light-shielding layer 31 away from the base substrate 1, but cannot reach a side of the first light-shielding layer 31 proximate to the base substrate 1.

As shown in FIG. 2, the first power line 5 includes a first power bus 51 and a plurality of first power sub-lines 52. At least one portion of the first power bus 51 is located in a region of the peripheral area 03 proximate to a side of the first display area 012. The plurality of first power sub-lines 52 are located in the first display area 012 and are electrically connected to the first power bus 51, and the plurality of first power sub-lines 52 are configured to provide first power signals to the plurality of first sub-pixels 41. Orthogonal projections of the plurality of first power sub-lines 52 on the base substrate 1 do not overlap with the orthogonal projections of the openings 31a of the first light-shielding layer 31 on the base substrate 1.

The first light-shielding layer 31 is electrically connected to the first power line 5. In this way, the first power line 5 provides the first power signal to the first light-shielding layer 31, so that the first light-shielding layer 31 receives a stable electrical signal to prevent an uncontrollable potential signal from being generated on the first light-shielding layer 31, and further avoid affecting normal operation of other structures in the display substrate 1A.

For example, a material of the first light-shielding layer 31 is not limited in the embodiments of the present disclosure as long as the material can realize a light shielding function. For example, the first light-shielding layer 31 may be made of black resin or metal. In a case where the first light-shielding layer 31 is made of a metal material, induced charges are easily generated on the first light-shielding layer 31, which may affect the plurality of first sub-pixels 41, e.g., cause voltages of the plurality of first sub-pixels 41 to be unstable.

Therefore, in some embodiments of the present disclosure, in the case where the first light-shielding layer 31 is made of the metal material, the first light-shielding layer 31 is electrically connected to the first power line 5, so that the first light-shielding layer 31 receives a constant electrical signal to prevent induced charges from being generated on the first light-shielding layer 31, thereby avoiding the influence of the induced charges generated on the first light-shielding layer 31 on the plurality of first sub-pixels 41.

Figure 6A:
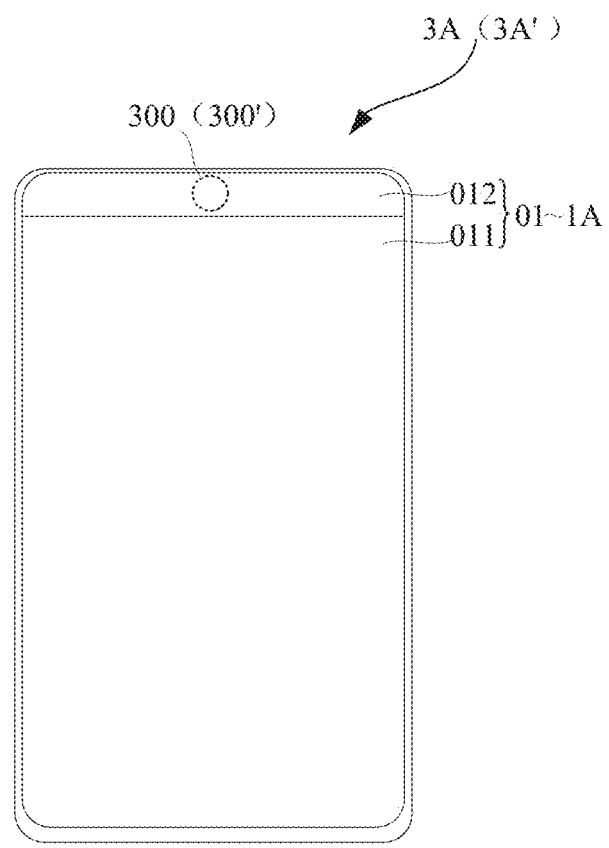
FIG. 6A is a structural diagram of a display apparatus, in accordance with some embodiments of the present disclosure.
Figure 6B:
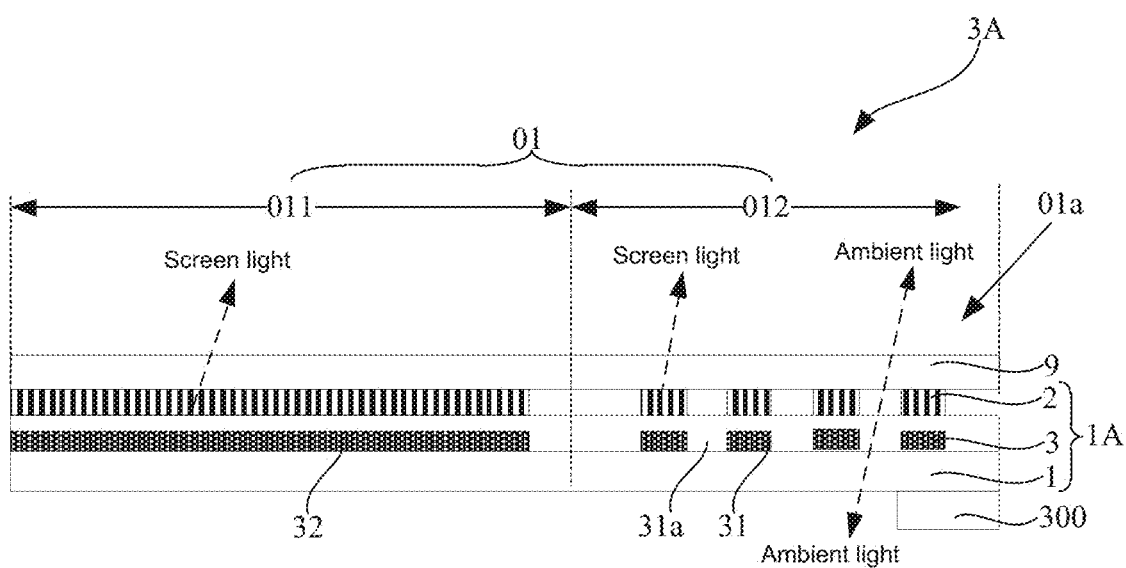
FIG. 6B is a structural diagram of another display apparatus, in accordance with some embodiments of the present disclosure.

The display substrate 1A provided in the embodiments of the present disclosure may be used to manufacture a display apparatus. As shown in FIGS. 6A and 6B, some embodiments of the present disclosure also provide a display apparatus 3A, and the display apparatus 3A includes the display substrate 1A and a front optical component 300. The front optical component 300 is disposed on a side of the display substrate 1A away from a display surface thereof, and an orthogonal projection of the front optical component 300 on the display substrate 1A is located within the first display area 012.

Figure 7:
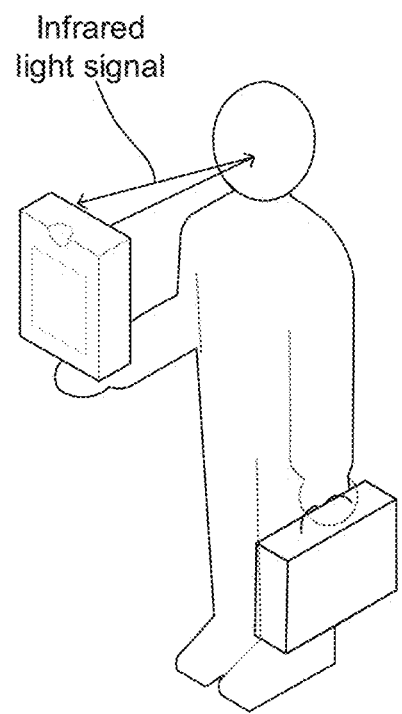
FIG. 7 is a schematic diagram showing operation of a display apparatus, in accordance with some embodiments of the present disclosure.

As shown in FIGS. 6A and 7, an example where the display apparatus 3A is a mobile phone 3A', and the front optical component 300 provided in the mobile phone 3A' is an infrared detection unit 300' is taken for description.

Since in the display substrate 1A, at the plurality of openings 31a of the first light-shielding layer 31, ambient light can enter from one side of the display substrate 1A, pass through the display substrate 1A, and exit from the other side of the display substrate 1A, if the infrared detection unit 300' is disposed at a non-display surface of the mobile phone 3A', there is no need to individually provide a region for placing the infrared detection unit 300' in the display area 01. As shown in FIG. 7, in a detection mode (i.e., when the infrared detection unit is turned on), the infrared light emitted by the infrared detection unit 300' can pass through regions in the display substrate 1A corresponding to the plurality of openings 31a of the first light-shielding layer 31, and then travel to a detected object (e.g., a person) in front of the display substrate 1A (i.e., opposite to the display surface of the mobile phone 3A'). In this way, the infrared light emitted by the infrared detection unit 300' is reflected by the detected object, and the reflected infrared light passes through the regions in the display substrate 1A corresponding to the plurality of openings 31a of the first light-shielding layer 31, and travels to the infrared detection unit 300' to realize a detection function.

That is, even if the infrared detection unit 300' is disposed at the non-display surface of the mobile phone 3A', its front detection function may also be realized. In addition, since both the first display area 012 and the second display area 011 included in the display area 01 of the display substrate 1A may perform display, that is, an entire display surface of the mobile phone 3A' may achieve display normally, there is no need to provide a region for placing the infrared detection unit 300' where display is not performed, which reduces an area of a non-display area (i.e., the peripheral area 03) of the mobile phone 3A', increases an area of the display area 01, and thereby increases the screen-to-body ratio of the mobile phone 3A'.

As can be seen from the above description, the display substrate 1A provided in the embodiments of the present disclosure may increase the screen-to-body ratio of the display apparatus.

Referring to FIG. 2, the first light-shielding layer 31 included in the display substrate 1A provided in the embodiments of the present disclosure may shield the ambient light from a side of the base substrate 1 away from the display layer 2 and prevent the ambient light from travelling to the display layer 2 (the display layer 2 including the first sub-pixels 41 and the signal lines, etc.) opposite to the first light-shielding layer 31. The ambient light includes invisible light, such as infrared light emitted by the infrared detection unit 300'. In this way, the first light-shielding layer 31 may prevent the infrared light emitted by the infrared detection unit 300' from travelling to the display layer 2, thereby avoiding an adverse effect of the infrared light on the display layer 2.

Figure 8:
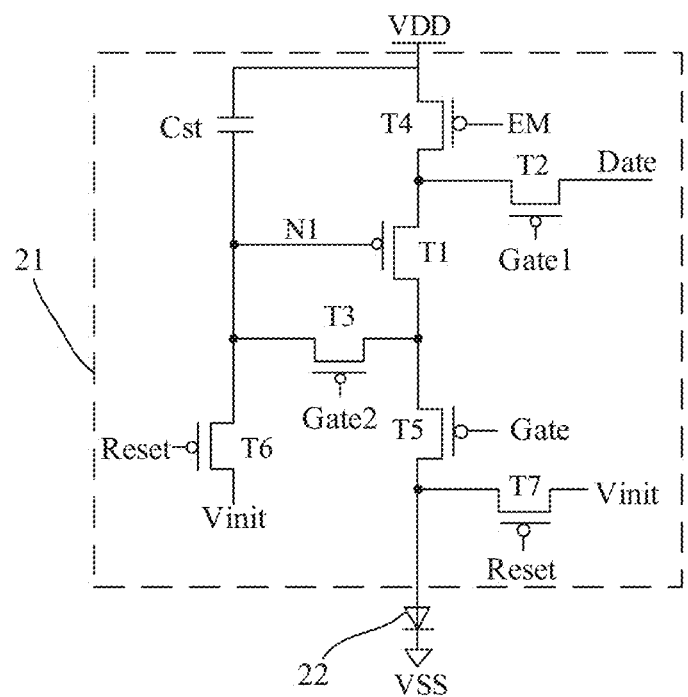
FIG. 8 is a circuit diagram of a pixel driving circuit in a display substrate, in accordance with some embodiments of the present disclosure.

For example, at least one first sub-pixel 41 of the plurality of first sub-pixels 41 includes thin film transistors and a storage capacitor, and the thin film transistors and the storage capacitor constitute a pixel driving circuit. For example, the pixel driving circuit 21 has the 7T1C structure as shown in FIG. 8. The pixel driving circuit 21 is electrically connected to a light-emitting device 22 to drive the light-emitting device 22 to emit light. Since a polysilicon channel of the thin film transistor (i.e., a region between a source and a drain of the thin film transistor when the thin film transistor is in an on state) is sensitive to energy, when the infrared light irradiates the thin film transistor, the polysilicon channel of the thin film transistor is prone to generate a photocurrent. This easily causes instability of the current in the pixel driving circuit 21, and causes instability of light emission of the light-emitting device 22, thereby affecting the display quality. Under action of the first light-shielding layer 31, the infrared light emitted by the infrared detection unit 300' cannot travel to the thin film transistor in the first sub-pixel 41, thereby avoiding an adverse effect of the infrared light on the thin film transistor.

In addition, the first light-shielding layer 31 may also shield a part of the screen light reflected by the detected object, which may reduce screen light passing through the first display area 012, and further reduce an adverse effect of the screen light on the front optical component 300. For example, an influence of the screen light on an information collection function of the infrared detection unit 300' is reduced.

Figure 9A:
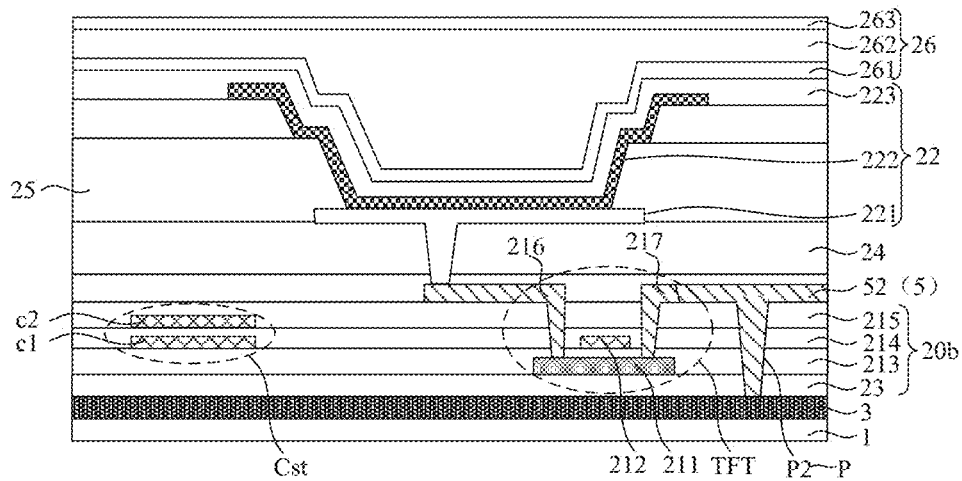
FIG. 9A is a sectional view of another display substrate, in accordance with some embodiments of the present disclosure.
Figure 9B:
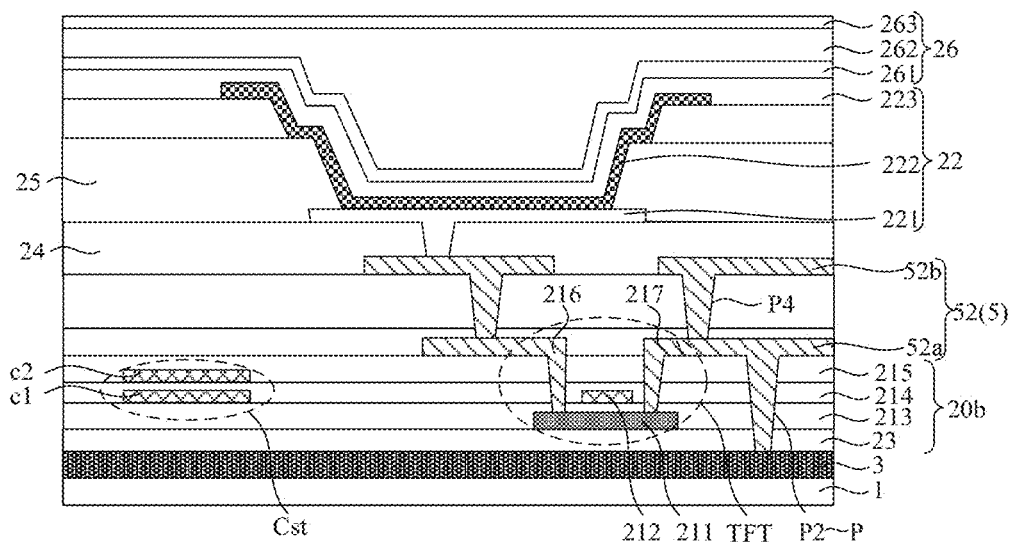
FIG. 9B is a sectional view of yet another display substrate, in accordance with some embodiments of the present disclosure.
Figure 9C:
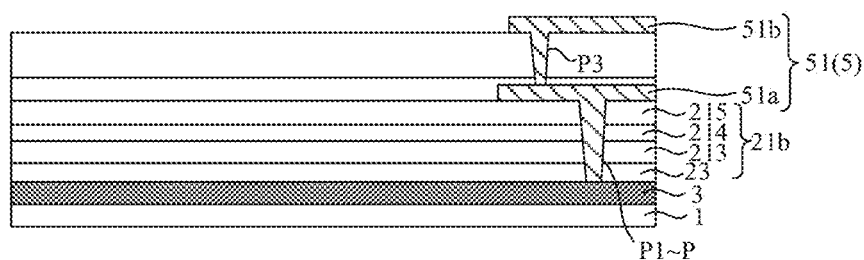
FIG. 9C is a sectional view of yet another display substrate, in accordance with some embodiments of the present disclosure.
Figure 10:
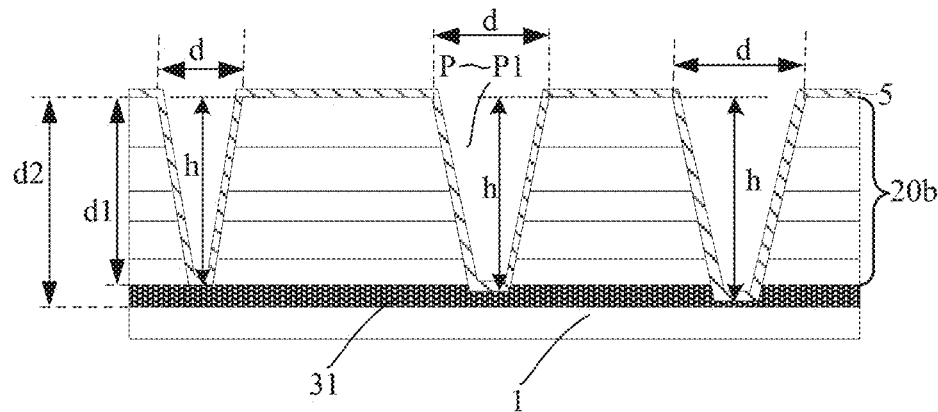
FIG. 10 is a sectional view of a plurality of via holes in a display substrate, in accordance with some embodiments of the present disclosure.

In some embodiments, as shown in FIGS. 9A to 10, the display substrate 1 further includes at least one insulating film 20b disposed between the first power line 5 and the first light-shielding layer 31, and the at least one insulating film 20b is provided with a plurality of via holes P extending through the at least one insulating film 20b. The first power line 5 is electrically connected to the first light-shielding layer 31 through the plurality of via holes P.

Figure 11A:
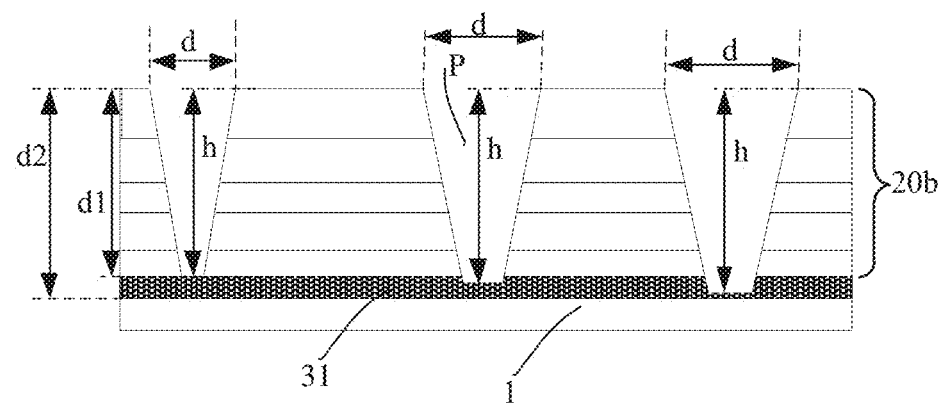
FIG. 11A is a sectional view of a plurality of via holes in another display substrate, in accordance with some embodiments of the present disclosure.
Figure 11B:
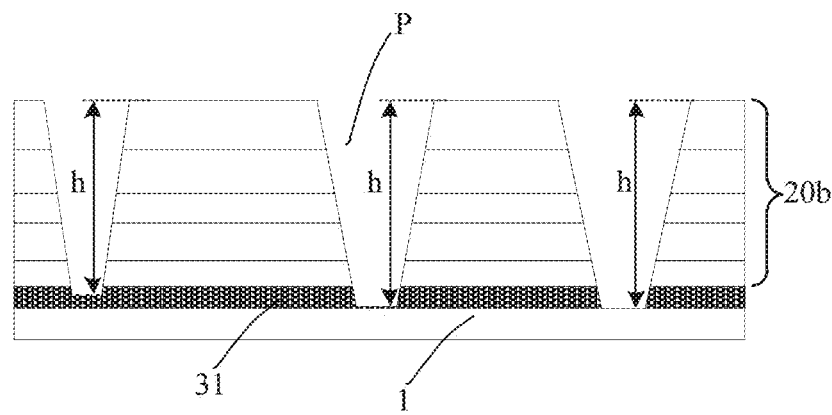
FIG. 11B is a sectional view of a plurality of via holes in yet another display substrate, in accordance with some embodiments of the present disclosure.
Figure 11C:
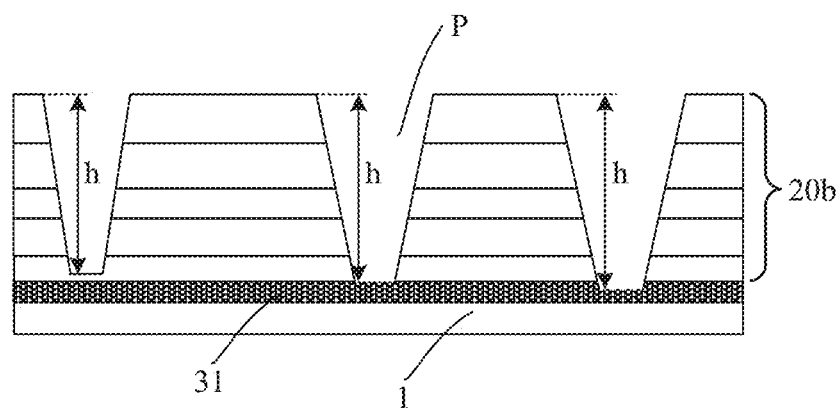
FIG. 11C is a sectional view of a plurality of via holes in yet another display substrate, in accordance with some embodiments of the present disclosure.

In some embodiments, as shown in FIGS. 10 to 11C, the plurality of via holes P includes at least two types of via holes P having different hole depths h (FIG. 10 illustrates three types of via holes P). In this way, a contact yield between the first power line 5 and the first light-shielding layer 31 may be improved.

It will be explained that, there are a plurality of insulating films 20b between the first power line 5 and the first light-shielding layer 31, and in order to realize an electrical connection between the first power line 5 and the first light-shielding layer 31, at least one via hole P need to be manufactured in the plurality of insulating films 20b, and each via hole P extends through the plurality of insulating films 20b. Since a depth h of the via hole P is relatively large, a problem of over-etching or under-etching is prone to occur in a process of manufacturing the via hole P.

The above embodiments, as shown in FIGS. 10 to 11C, are illustrated with the plurality of via holes P including three types of via holes P having different hole depths h.

For example, referring to FIGS. 10 and 11A, the depth h of each via hole P in the plurality of via holes P is greater than or equal to a distance d1 between a surface of the first power line 5 proximate to the base substrate 1 and a surface of the light-shielding layers 31 away from the base substrate 1 that are opposite in a direction perpendicular to the base substrate 1, and is less than a distance d2 between the surface of the first power line 5 proximate to the base substrate 1 and a surface of the base substrate 1 proximate to the light-shielding layers 31 that are opposite in the direction perpendicular to the base substrate 1.

In this way, if an over-etching situation as shown in FIG. 11B occurs, or an under-etching situation as shown in FIG. 11C occurs, it may be at least ensured that the first power line 5 is electrically connected to the first light-shielding layer 31 through a type of via hole P, thereby improving the contact yield between the first power line 5 and the first light-shielding layer 31.

For example, as shown in FIG. 11A, in some embodiments, three types of via holes P having different hole depths h are manufactured.

As shown in FIG. 11A, a hole depth h of a first type of via hole P is equal to the distance d1 between the surface of the first power line 5 proximate to the base substrate 1 and the surface of the first light-shielding layer 31 away from the base substrate 1 that are opposite in the direction perpendicular to the base substrate 1. That is, the first type of via hole P exposes an upper surface of the first light-shielding layer 31 (i.e., a surface of the first light-shielding layer 31 away from the base substrate). Hole depths h of a second type of via hole P and a third type of via hole P are greater than the distance d1 between the surface of the first power line 5 proximate to the base substrate 1 and the surface of the first light-shielding layer 31 away from the base substrate 1 that are opposite in the direction perpendicular to the base substrate 1, and is less than the distance d2 between the surface of the first power line 5 proximate to the base substrate 1 and the surface of the base substrate 1 proximate to the light-shielding layers 31 that are opposite in the direction perpendicular to the base substrate 1. Moreover, the hole depth h of the second type of via hole P is less than the hole depth h of the third type of via hole P.

Referring to FIG. 11C, when the under-etching situation occurs, the two types of via holes P having larger hole depths h expose the first light-shielding layer 31, and the first power line 5 can be electrically connected to the first light-shielding layer 31 through the other two types of via holes P.

Referring to FIG. 11B, when the over-etching situation occurs, the first power line 5 may be electrically connected to the first light-shielding layer 31 through the two types of via holes P having smaller hole depths h.

Based on this, by providing at least two types of via holes P having different hole depths h in the plurality of insulating films 20b of the display substrate 1A, the contact yield between the first power line 5 and the first light-shielding layer 31 is improved, and the reliability of the electrical connection between the first power line 5 and the first light-shielding layer 31 is further improved.

In some embodiments, as shown in FIGS. 10 and 11A, the plurality of via holes P includes at least two types of via holes P having different hole diameters d (FIGS. 10 and 11A illustrate three types of via holes P). The hole diameter d is referred to a diameter of a surface of the via hole P away from the base substrate 1. In this way, it is possible to improve the contact yield between the first power line 5 and the first light-shielding layer 31.

In some embodiments, referring to FIGS. 10 and 11A, the plurality of via holes P include at least two types of via holes P having different hole depths h and different hole diameters d (FIGS. 10 and 11A illustrate three types of via holes P). In this way, the contact yield between the first power line 5 and the first light-shielding layer 31 may be improved.

Arrangement manners and positions of the plurality of via holes P have following situations.

In some embodiments, as shown in FIG. 2, the first light-shielding layer 31 is also located in the peripheral area 03, the plurality of via holes P include a plurality of first via holes P1 located in the peripheral area 03, and the first light-shielding layer 31 is electrically connected to the first power bus 51 through the plurality of first via holes P1, thereby realizing the electrical connection between the first light-shielding layer 31 and the first power line 5.

In the peripheral area 03, the arrangement manner of the plurality of first via holes P1 includes but is not limited to the following manners.

As shown in FIG. 2, the plurality of first via holes P1 include at least one first via hole group M (FIG. 2 illustrates four first via hole groups M). Each first via hole group M includes at least one first via hole column m (FIG. 2 illustrates five first via hole columns m). Hole depths h of first via holes P1 in each first via hole column m are different. It will be noted that a larger black dot in FIG. 2 indicates a first via hole P1 having a larger hole depth h, and a smaller black dot in FIG. 2 indicates a first via hole P1 having a smaller hole depth h.

In this way, in the peripheral area 03, the first power bus 51 and the first light-shielding layer 31 may be in contact through the at least one first via hole group M, which increases a contact area between the first power bus 51 and the first light-shielding layer 31, and thus the contact yield between the first power bus 51 and the first light-shielding layer 31 is improved.

As shown in FIG. 2, in some embodiments, first via holes P1 in each first via hole group M are arranged in an array.

Here, the array arrangement may be an arrangement in a way of a plurality of rows and a plurality of columns. For example, three rows and five columns are illustrated in FIG. 2. A row direction and a column direction in which the first via holes P1 in each first via hole group M are arranged are set as a first direction D1 and a second direction D2, respectively. It can be understood that the row direction and the column direction in which the first via holes P1 are arranged intersect with each other. That is, the first direction D1 and the second direction D2 intersect with each other. For example, the first direction D1 and the second direction D2 are perpendicular to each other.

In some embodiments, the plurality of first via holes P1 includes three types of via holes having different hole depths h, and the number of first via hole columns m in each first via hole group M is multiple, such as, three, four, five, six, seven, etc.

Figure 14:
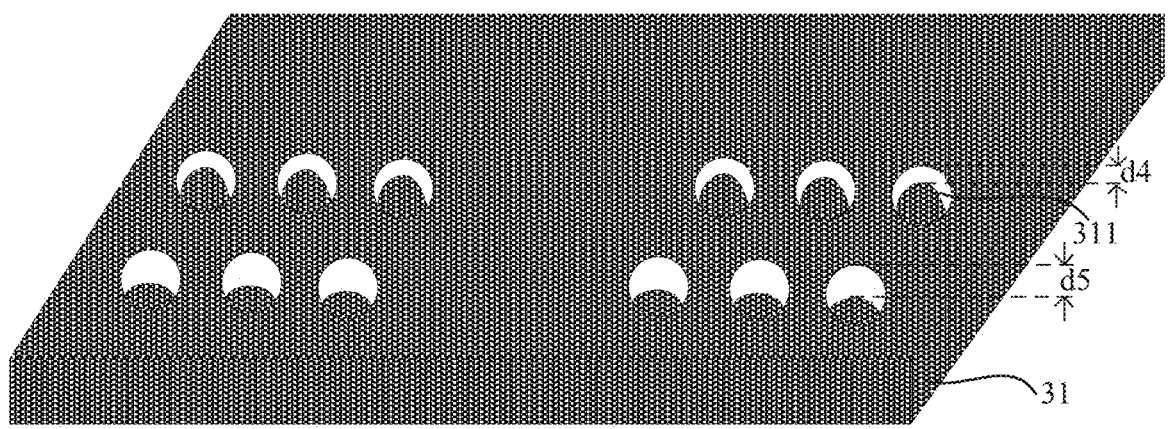
FIG. 14 is a schematic diagram illustrating a partial region of the first light-shielding layer, in accordance with some embodiments of the present disclosure.

In some embodiments, as shown in FIG. 14, a surface of the first light-shielding layer 31 away from the base substrate 1 has depressions 311 corresponding to at least part of the plurality of first via holes P1, and the depressions 311 have at least two types of depths d4 and d5. FIG. 14 illustrates only a partial region of the first light-shielding layer 31.

An arrangement manner of the first via holes P1 in each first via hole group M is described in detail below by taking the plurality of first via holes P1 in these embodiments as an example, that is, the plurality of first via holes P1 include three types of first via holes P1 having different hole depths h, and the number of first via hole columns m in each first via hole group M is multiple. It can be understood that the arrangement manner of the first via holes P1 in each first via hole group M includes but is not limited to the following manners.

As shown in FIG. 2, each first via hole column m includes three first via holes P1 having different hole depths h, and the three first via holes P1 are arranged in the second direction D2. The first via hole columns m are arranged in the first direction D1, and first via holes P1 having a same hole depth h in the first via hole columns m are arranged in a row in the first direction D1.

In some examples, an arrangement manner of the first via holes P1 in each first via hole group M adopts the arrangement manner as described above, and the number of first via hole groups M is multiple, such as three, four, five, six, seven, etc. The multiple first via hole groups M are arranged in the first direction D1. The multiple first via hole columns m in each first via hole group M are arranged in the first direction D1, and the first via holes P1 having the same hole depth h in the multiple first via hole columns m are arranged in the row in the first direction D1.

In some embodiments, the plurality of first via holes P1 include at least one first via hole group M (FIG. 2 illustrates four first via hole groups M), each first via hole group M includes at least one first via hole column m (FIG. 2 illustrates five first via hole columns m), and hole diameters d of first via holes P1 in each first via hole column m are different. In this way, in the peripheral area 03, the first power bus and the first light-shielding layer 31 may be in contact through the at least one first via hole group M, which increases the contact area between the first power bus 51 and the first light-shielding layer 31, and thereby improves the contact yield between the first power bus 51 and the first light-shielding layer 31.

For example, the number of first via hole groups M is multiple, such as three, four, five, six, seven, etc. The number of first via hole columns m in each first via hole group M is multiple, such as three, four, five, six, seven, etc. The multiple first via hole groups M are arranged in the first direction D1. The multiple first via hole columns m in each first via hole group M are arranged in the first direction D1, and first via holes P1 having a same hole diameter d in the multiple first via hole columns m are arranged in a row in the first direction D1.

In some embodiments, as shown in FIG. 2, on a basis that the plurality of via holes includes the plurality of first via holes P1 disposed in the peripheral area 03, the plurality of via holes further includes a plurality of second via holes P2 located in the first display area 012. The first light-shielding layer 31 is electrically connected to at least part of the plurality of first power sub-lines 52 through the plurality of second via holes P2, thereby achieving the electrical connection between the first light-shielding layer 31 and the first power line 5.

The plurality of second via holes P2 are provided in the first display area 012, and the first light-shielding layer 31 is electrically connected to the plurality of first power sub-lines 52 through the plurality of second via holes P2. In this way, the first light-shielding layer 31 may not only receive the first power signal through the first power bus 51 in the peripheral area 03, but also receive the first power signals through the plurality of first power sub-lines 52 in the first display area 012, which may ensure that the first light-shielding layer 31 may uniformly receive the first power signals, thereby preventing uncontrollable induced charges from being generated on the first light-shielding layer 31 more effectively, and ensuring the normal operation of the plurality of first sub-pixels 41.

In some examples, the plurality of second via holes P2 are evenly distributed in the first display area. In this way, in the first display area 012, part of the plurality of first power sub-lines 52 may be electrically connected to the first light-shielding layer 31 more uniformly through the plurality of second via holes P2, thereby ensuring that the first light-shielding layer 31 may uniformly receive the first power signals.

In some embodiments, as shown in FIG. 2, three first sub-pixels 41 are provided at a position among every four openings of the first light-shielding layer 31 and constitute one pixel 4*a*, and one pixel 4*a* corresponds to at least one second via hole P2.

For example, as shown in FIG. 2, the first light-shielding layer 31 has the plurality of openings 31*a* arranged in an array, and the plurality of first sub-pixels 41 are grouped in a way that three first sub-pixels 41 are in a group to form a plurality of pixels 4*a* arranged in an array. One pixel 4*a* is provided among every four openings 31*a*, and each pixel 4*a* corresponds to one second via hole P2.

Based on the arrangement manner of the plurality of first sub-pixels 41, the plurality of first power sub-lines 52 are grouped in a way that three first power sub-lines 52 are in a group, and the first power sub-line 52 extends in the second direction D2. A row direction in which the plurality of pixels 4*a* arranged in an array are arranged is the same as the first direction D1, and a column direction in which the plurality of pixels 4*a* are arranged is the same as the second direction D2. Each group of first power sub-lines 52 corresponds to a column of pixels 4*a*, and each first power sub-line 52 corresponds to a column of first sub-pixels 41.

In the display substrate 1A, each column of pixels 4*a* that are arranged in the second direction D2 corresponds to one first via hole group M, that is, each group of first power sub-lines 52 corresponds to one first via hole group M. In this way, the multiple first via hole groups M may be prevented from being locally concentrated in the peripheral area 03, that is, the multiple first via hole groups M may be evenly distributed in the peripheral area 03 in the first direction D1, thereby improving distribution uniformity of contact positions between the first power bus 51 and the first light-shielding layer 31, and further improving uniformity of the signal received by the first light-shielding layer 31.

In some other embodiments, the plurality of via holes includes a plurality of second via holes P2 located in the first display area 012, and the first light-shielding layer 31 is electrically connected to at least part of the plurality of first power sub-lines 52 through the plurality of second via holes P2, thereby achieving the electrical connection between the first light-shielding layer 31 and the first power line 5.

The plurality of second via holes P2 are disposed in the first display area 012, and the first light-shielding layer 31 is electrically connected to at least part of the plurality of first power sub-lines 52 through the plurality of second via holes P2. In this way, the first light-shielding layer 31 may be electrically connected to the at least part of the plurality of first power sub-lines 52 through the plurality of second via holes P2, so that the first light-shielding layer 31 may uniformly receive the first power signals, thereby preventing uncontrollable induced charges from being generated on the first light-shielding layer 31 more effectively, and ensuring the normal operation of the plurality of first sub-pixels 41.

In some examples, the plurality of second via holes P2 are evenly distributed in the first display area 012. In this way, in the first display area 012, part of the plurality of first power sub-lines 52 may be more uniformly electrically connected to the first light-shielding layer 31 through the plurality of second via holes P2, thereby ensuring that the first light-shielding layer 31 may uniformly receive the first power signals.

In some embodiments, as shown in FIG. 2, three first sub-pixels 41 are provided at a position among every four openings 31*a* of the first light-shielding layer 31 and constitute one pixel 4*a*, and one pixel 4*a* corresponds to at least one second via hole P2.

For example, as shown in FIG. 2, the first light-shielding layer 31 has the plurality of openings 31*a* arranged in an array, and the plurality of first sub-pixels 41 are grouped in a way that three first sub-pixels 41 are in a group to form a plurality of pixels 4*a* arranged in an array. One pixel 4*a* is provided among every four openings, and each pixel 4*a* corresponds to one second via hole P2, thereby ensuring that the plurality of second via holes P2 are evenly distributed in the first display area 012.

In some embodiments, the first light-shielding layer 31 is also located in the peripheral area 03, and on a basis that the plurality of via holes P include the plurality of second via holes P2 located in the first display area 012, the plurality of via holes P further include a plurality of first via holes P1 disposed in the peripheral area 03. The first light-shielding layer 31 is electrically connected to the first power bus 51 through the plurality of first via holes P1, thereby achieving the electrical connection between the first light-shielding layer 31 and the first power line 5.

In the peripheral area 03, the arrangement manner of the plurality of first via holes P1 may be referred to the above description, which will not be repeated herein.

With continued reference to FIGS. 2 to 4, the second display area 011 of the display substrate 1A will be described below. In some examples, the second display area 011 is located on a side of the first display area 012 away from the first power bus 51.

As shown in FIGS. 2, 3A and 3B, the display substrate 1A further includes a second light-shielding layer 32, a plurality of second sub-pixels 42 and a second power line 6. It will be noted that, in FIGS. 3A and 3B, for convenience of understanding, sectional patterns of structures including the plurality of second sub-pixels 42 and their corresponding signal lines (including the second power line 6) that are disposed at a side of the second light-shielding layer 32 away from the base substrate 1 are combined into one body, which is illustrated as another portion of the display layer 2.

The second light-shielding layer 32 is disposed on a side of the base substrate 1, the second light-shielding layer 32 is located in the second display area 011, and the second light-shielding layer 32 and the first light-shielding layer 31 are located in a same layer.

The plurality of second sub-pixels 42 are disposed at the side of the second light-shielding layer 32 away from the base substrate 1, and are located in the second display area 011.

As shown in FIG. 2, the second power line 6 includes a second power bus 61 and a plurality of second power sub-lines 62. At least one portion of the second power bus 61 is located in a region of the peripheral area proximate to a side of the second display area 011. The plurality of second power sub-lines 62 are located in the second display area 011 and are electrically connected to the second power bus 61, and the plurality of second power sub-lines 62 are configured to provide second power signals to the plurality of second sub-pixels 42.

In the display substrate 1A, the second light-shielding layer 32 is configured to shield the ambient light and prevent the ambient light from passing through the display substrate 1A in the second display area 011. In addition, the second light-shielding layer 32 is also configured to shield light (i.e., screen light) emitted by the light-emitting devices of the display substrate 1A. That is, the light emitted by the light-emitting devices can travel towards a side of the light-emitting devices away from the base substrate 1, but cannot reach a side of the second light-shielding layer 32 proximate to the base substrate 1.

Moreover, the second light-shielding layer 32 is provided, and the second light-shielding layer 32 and the first light-shielding layer 31 are located in the same layer, which may reduce a film thickness difference between the first display area 012 and the second display area 011 of the display substrate 1A, and improve flatness of the display substrate 1A.

In some embodiments, the second light-shielding layer 32 is electrically connected to the second power line 6. In this way, the second power line 6 provides the second power signal to the second light-shielding layer 32, so that the second light-shielding layer 32 receives a stable electrical signal to prevent an uncontrollable potential signal from being generated on the second light-shielding layer 32, and avoid affecting the normal operation of other structures in the display substrate 1A, for example, avoid an influence of induced charges generated on the second light-shielding layer 32 on the plurality of second sub-pixels 42.

In some embodiments, the at least one insulating film 20b is also disposed between the second power line 6 and the second light-shielding layer 32, and the at least one insulating film is provided with a plurality of other via holes extending through the at least one insulating film. The second power line 6 is electrically connected to the second light-shielding layer 32 through the plurality of other via holes.

With regard to a specific arrangement of the plurality of other via holes and a structure of the plurality of second sub-pixels 42, reference may be made to the above description of the specific arrangement of the plurality of via holes and the structure of the plurality of first sub-pixels 41 in the first display area 012 of the display substrate 1A, which will not be repeated herein.

In some embodiments, as shown in FIG. 2, a distribution density of the plurality of second sub-pixels 42 is greater than a distribution density of the plurality of first sub-pixels 41. For example, a pixel distribution density of the first display area 012 is 300 pixels per inch (PPI), and a pixel distribution density of the second display area 011 is 400 PPI.

As shown in FIG. 2, in the first display area 012, the plurality of first sub-pixels 41 are grouped in a way that three first sub-pixels 41 are in a group to form a plurality of pixels 4a arranged in an array, and one pixel 4a is provided among every four openings 31a. In this case, the distribution density of the plurality of first sub-pixels 41 is relatively low. In the second display area 0121, the plurality of second sub-pixels 42 are arranged in an array, and the distribution density of the plurality of second sub-pixels 42 is relatively high. On a premise of a same area, the number of the plurality of first sub-pixels 41 in the first display area 012 is less than the number of the plurality of second sub-pixels 42 in the second display area 011.

Through such arrangement, on a premise that the display area 01 of the display substrate 1A can display images, the distribution density of the plurality of second sub-pixels 42 is greater than the distribution density of the plurality of first sub-pixels 41, that is, the number of first sub-pixels 41 in the first display area 012 is reduced relative to the second display area 011, so that a space occupied by the first sub-pixels 41 in the first display area 012 is reduced. Moreover, by providing the plurality of openings 31a in the first light-shielding layer 31, a space may be left for light to pass through, so that the first display area 012 has a high light transmittance.

In this way, in a case where the display substrate 1A is applied to the display apparatus 3A, as shown in FIG. 6B, the front optical component 300 is disposed on a side of the display substrate 1A away from the display surface thereof, and the orthogonal projection of the front optical component 300 on the display substrate 1A is located in the first display area 012. In this way, light emitted by the front optical component 300 may pass through the first display area 012 of the display substrate 1A with higher light transmittance, and light from an outside of the display apparatus may also pass through the first display area 012 with higher light transmittance of the display substrate 1A to be sensed by the front optical component 300, so that the front optical component 300 may realize a corresponding sensing function.

In some embodiments, the first power signal transmitted by the first power line 5 is the same as the second power signal transmitted by the second power line 6, or the first power signal transmitted by the first power line 5 is different from the second power signal transmitted by the power line 6.

For example, in a case where the first power signal is different from the second power signal, the first power signal is less than the second power signal.

Since the distribution density of the plurality of second sub-pixels 42 is greater than the distribution density of the plurality of first sub-pixels 41, the first light-shielding layer 31 has a plurality of openings 31a, and an area of the first light-shielding layer 31 is small compared to the second light-shielding layer 32, the first power signal required by the plurality of first sub-pixels 41 and the first light-shielding layer 31 is relatively small. Therefore, a magnitude relationship between the first power signal and the second power signal is set to that the first power signal is less than the second power signal, which reasonably distribute the first power signal and the second power signal.

It can be understood that, in the display substrate 1A, an insulating layer for insulation is provided between different conductive layers. In some embodiments, as shown in FIGS. 9A and 9B, the at least one insulating film 20b disposed between the first power line 5 and the first light-shielding layer 31 includes a first insulating layer 23 located between the first light-shielding layer 31 and the plurality of first sub-pixels 41, and the first light-shielding layer 31 and the plurality of first sub-pixels 41 are insulated from each other through the first insulating layer 23, thereby preventing signal crosstalk between the first light-shielding layer 31 and the plurality of first sub-pixels 41.

In a case where the display substrate 1A further includes the second light-shielding layer 32, the first insulating layer 23 is also disposed between the second light-shielding layer 32 and the plurality of second sub-pixels 42. For example, the first insulating layer 23 is a whole layer located in the first display area 012 and the second display area 011. The second light-shielding layer 32 and the plurality of second sub-pixels 42 are insulated from each other through the first insulating layer 23, thereby preventing signal crosstalk between the second light-shielding layer 32 and the plurality of second sub-pixels 42.

At least one first sub-pixel 41 of the plurality of first sub-pixels 41 includes thin film transistors and a storage capacitor. The thin film transistors and the storage capacitor constitute a pixel driving circuit. The first sub-pixel 41 further includes a light-emitting device electrically connected to the pixel driving circuit, and the pixel driving circuit drives the light-emitting device to emit light. Similarly, at least one second sub-pixel 42 of the plurality of second sub-pixels 42 includes thin film transistors and a storage capacitor.

As shown in FIGS. 9A and 9B, the at least one insulating film 20b disposed between the first power line 5 and the first light-shielding layer 31 further includes a first gate insulating layer 213, a second gate insulating layer 214 and an interlayer insulating layer 215. The thin film transistor TFT includes: an active layer 211 located on a side of the first insulating layer 23 away from the base substrate 1, the first gate insulating layer 213 being located on a side of the active layer 211 away from the base substrate 1; a gate 212 located on a side of the first gate insulating layer 213 away from the base substrate 1, the second gate insulating layer 214 being located on a side of the gate 212 away from the base substrate 1, the interlayer insulating layer 215 being located on a side of the second gate insulating layer 214 away from the base substrate 1; and a source 216 and a drain 217 located on a side of the interlayer insulating layer 215 away from the base substrate 1.

The storage capacitor Cst includes a first electrode plate c1 and a second electrode plate c2, the first electrode plate c1 and the gate 212 are located in the same layer, and the second electrode plate c2 is located between the second gate insulating layer 214 and the interlayer insulating layer 215.

As shown in FIGS. 9A and 9B, the aforementioned at least one insulating film 20b includes the first insulating layer 23, the first gate insulating layer 213, the second gate insulating layer 214 and the interlayer insulating layer 215.

For example, as shown in FIG. 9A, in the first display area 012 of the display substrate 1A, the first power sub-line 52 is disposed in the same layer as the source 216 and the drain 217 of the thin film transistor TFT. For example, the first power sub-line 52 is electrically connected to the drain 217 of the thin film transistor TFT to provide the first power signal for the first sub-pixel 41. In a case where the at least one insulating film 20b between the first power sub-line 52 and the first light-shielding layer 31 includes the first insulating layer 23, the first gate insulating layer 213, the second gate insulating layer 214 and the interlayer insulating layer 215, the second via hole P2 extends through the first insulating layer 23, the first gate insulating layer 213, the second gate insulating layer 214 and the interlayer insulating layer 215, so as to realize electrical connection between the first power sub-line 52 and the first light-shielding layer 31.

In some embodiments, as shown in FIG. 9B, at least one first power sub-line 52 of the plurality of first power sub-lines 52 includes a third sub-layer 52a and a fourth sub-layer 52b, and the third sub-layer 52a is electrically connected to the fourth sub-layer 52b through a fourth via hole P4.

In the above embodiments, at least one first power sub-line 52 includes two layers, insulating layer(s) are provided between the third sub-layer 52a and the fourth sub-layer 52b, and the fourth via hole P4 extends through the insulating layer(s) to electrically connect the third sub-layer 52a and the fourth sub-layer 52b of the first power sub-line 52. Therefore, the third sub-layer 52a and the fourth sub-layer 52b are connected in parallel. Through such arrangement, a resistance of the first power sub-line 52 may be reduced, so that the loss of the first power signal in a transmission process is reduced, which is conducive to the transmission of the first power signal in the first power sub-line 52. For example, as shown in FIG. 9B, in a case where the at least one first power sub-line 52 includes the third sub-layer 52a and the fourth sub-layer 52b, the first light-shielding layer 31 is electrically connected to the third sub-layer 52a of the first power sub-line 52 through the second via hole P2, thereby achieving the electrical connection between the first light-shielding layer 31 and the first power sub-line 52.

In some embodiments, as shown in FIG. 9C, the first power bus 51 includes a first sub-layer 51a and a second sub-layer 51b, and the first sub-layer 51a is electrically connected to the second sub-layer 51b through a third via hole P3. The first power bus 51 includes two layers, the insulating layer(s) are provided between the first sub-layer and the second sub-layer, and the third via hole extends through the insulating layer(s) to electrically connect the first sub-layer and the second sub-layer of the first power bus 51. Therefore, the first sub-layer and the second sub-layer are connected in parallel. Through such arrangement, a resistance of the first power bus 51 may be reduced, so that the loss of the first power signal in a transmission process is reduced, which is conducive to the transmission of the first power signal.

As shown in FIGS. 5A to 5G, a structure of the display substrate 1A is specifically introduced below by combining layout diagrams of light-shielding layers (including the first light-shielding layer 31 and the second light-shielding layer 32), the plurality of first sub-pixels 41, the plurality of second sub-pixels 42 and a plurality of signal lines in the display substrate 1A. The plurality of signal lines include the first power sub-lines 52, the second power sub-lines 62, data lines, gate lines (i.e., scanning signal lines), common electrode line(s), initialization signal lines, and the like.

As shown in FIGS. 5A to 5F, on a premise that the insulating films are not taken into consideration, in a direction that is perpendicular to the base substrate 1 and from a side close to the base substrate 1 pointing to another side away from the base substrate 1, layers included in the display substrate 1A are sequentially light-shielding layers (including the first light-shielding layer 31 and the second light-shielding layer 32), an active semiconductor layer 41a (i.e., a layer where the active layer 211 of the thin film transistor TFT is located), a first conductive layer 81 (i.e., a layer where the gate 212 of the thin film transistor TFT and the first electrode plate c1 of the storage capacitor Cst are located), a second conductive layer 82 (i.e., a layer where the second electrode plate c2 of the storage capacitor Cst is located), connection via holes K and a third conductive layer 83 (i.e., a layer where the source 216 and the drain 217 of the thin film transistor are located, that is, the layer where the third sub-layer 52a of the first power sub-line 52 is located). The overall layout diagram shown in FIG. 5G may be obtained by sequentially arranging the above film layers.

In some embodiments, the active semiconductor layer 41a may be formed by patterning a semiconductor material. The active semiconductor layer 41a may be used to form active layers of a plurality of transistors of the pixel driving circuit 21 in the first sub-pixel 41 or the second sub-pixel 42. As shown in FIG. 8, the pixel driving circuit 21 includes a driving transistor T1, a data writing transistor T2, a threshold compensation transistor T3, a first light emission control transistor T4, a second light emission control transistor T5, a first reset transistor T6 and a second reset transistor T7.

Each active layer may include a source region, a drain region, and a channel region between the source region and the drain region. For example, the active layers of the transistors are formed into a one-piece structure.

For example, the active semiconductor layer 41a may be made of amorphous silicon, polysilicon, an oxide semiconductor material, or the like. It will be noted that the source region and the drain region may be regions doped with n-type impurities or p-type impurities.

Figure 5A:
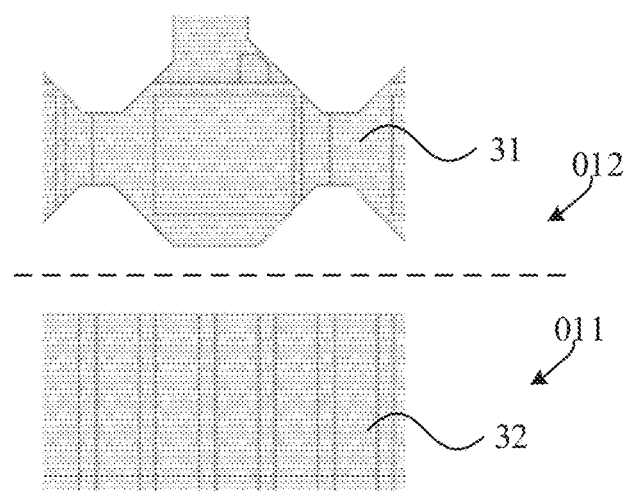
FIGS. 5A to 5G are diagrams illustrating film layers in the region Q of the display substrate shown in FIG. 2.
Figure 5B:
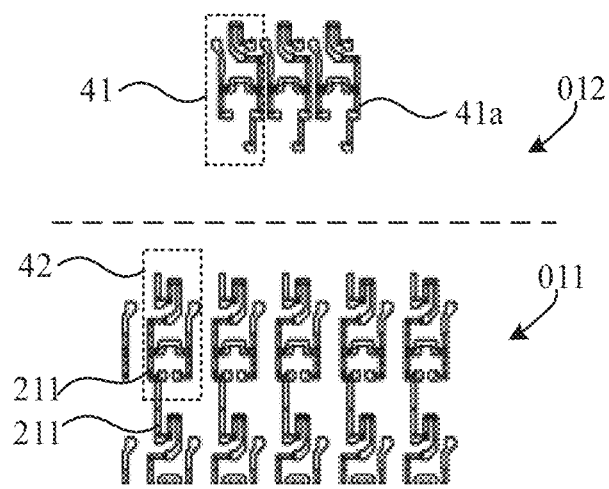
Figure 5C:
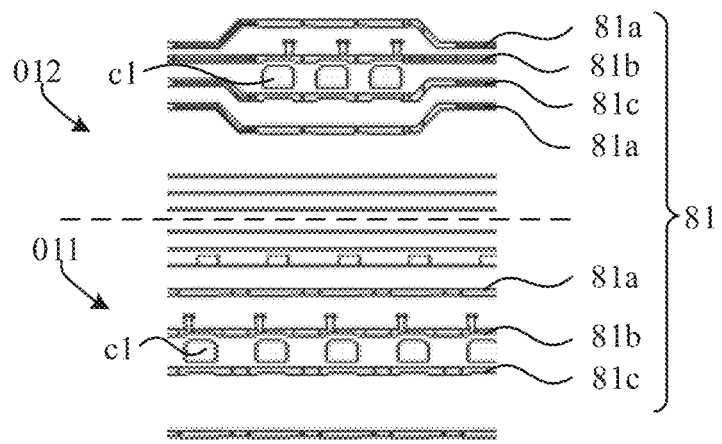
Figure 5D:
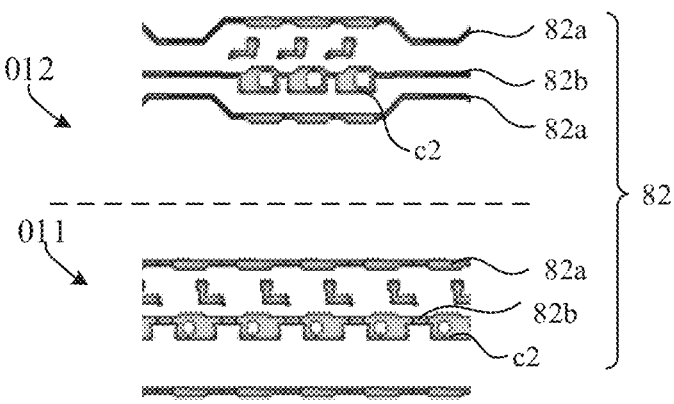
Figure 5E:
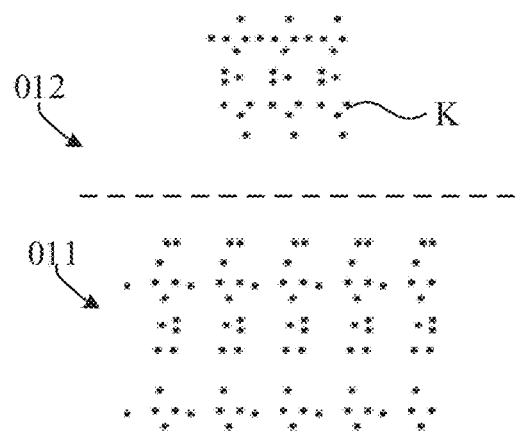

In some embodiments, as shown in FIGS. 2, 5C and 5D, the first conductive layer 81 includes a plurality of first signal lines extending in the first direction D1. For example, the plurality of first signal lines include reset control signal lines 81a (reset), scanning signal lines 81b (gate) and light emission control signal lines 81c (EM). In some examples, the first conductive layer 81 further includes the first electrode plate c1 of the storage capacitor Cst. The second conductive layer 82 includes a plurality of second signal lines extending in the first direction D1. For example, the plurality of second signal lines include initialization signal lines 82a (vinit), and voltage signal lines 82b (VD). In some examples, the second conductive layer 82 further includes the second electrode plate c2 of the storage capacitor Cst.

In the first display area 012, portions of the first signal lines and portions of the second signal lines between two adjacent pixels 4a (the pixel including three first sub-pixels 41) are converged relative to portions of the first signal lines and portions of the second signal lines located in a region where the pixel 4a is located. Such a design is conducive to increase an area of the openings 31a and improve the light transmittance of the display substrate 1A provided in the embodiments of the present disclosure. In the second display area 011, the first signal lines 81a and the second signal lines 82a extend in the first direction D1, along the first direction D1, a distance, in the second direction D2, between two first signal lines 81a is the same, and a distance, in the second direction D2, between two second signal lines 82a is the same. The first signal lines 81a are parallel to one another, the second signal lines 82a are parallel to one another, and the first signal lines 81a and the second signal lines 82a are not designed to be converged.

It will be noted that, in the first conductive layer 81, the number of first signal lines (e.g., four) in each group located in the first display area 012 is greater than the number of first signal lines (e.g., three) in each group located in the second display area 011. In the second conductive layer 82, the number of second signal lines (e.g., three) in each group located in the first display area 012 is greater than the number of second signal lines (e.g., two) in each group located in the second display area 011. The reason is that the distribution density of the second sub-pixels 42 is greater than the distribution density of the first sub-pixels 41, and active layers 211 of two adjacent second sub-pixels 42 in a same column are connected to each other (referring to FIG. 5B), so that in the second display area 011, a reset control signal line 81a (reset) in one group of first signal lines and an initialization signal line 82a (vinit) in one group of second signal lines can be shared by two adjacent second sub-pixels 42 in the same column. However, in the first display area 012, the portions of the first signal lines and the second signal lines are converged, the distribution density of the first sub-pixels 41 is lower, a distance between the first sub-pixels 41 is longer, and a reset control signal line 81a (reset) and an initialization signal line 82a (vinit) cannot be shared by two adjacent first sub-pixels 41 in a same column, and thus the numbers of first signal lines and second signal lines located in the first display area 012 are larger.

Figure 5F:
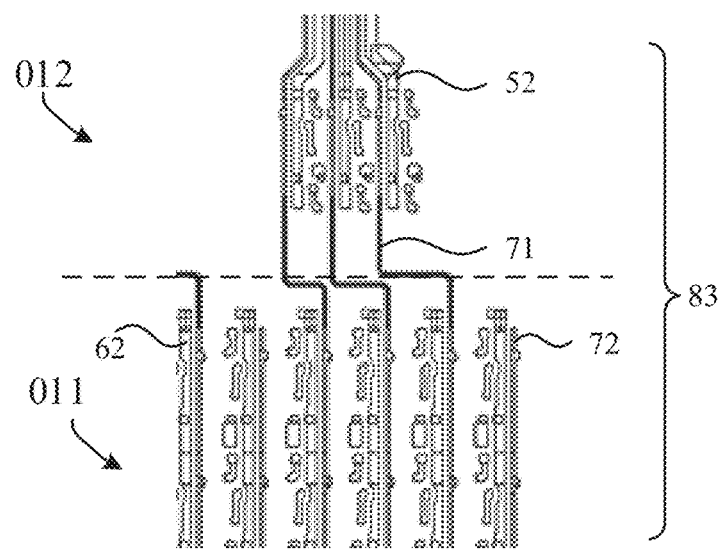
Figure 5G:
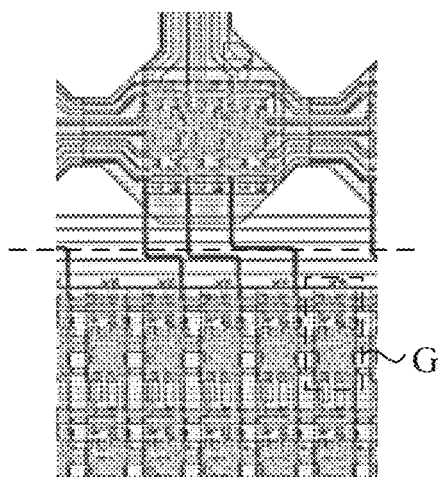

In some embodiments, as shown in FIGS. 2 and 5F, the third conductive layer 83 includes third signal lines extending in the second direction D2. For example, the third signal lines include a plurality of first power sub-lines 52 (VDD1) located in the first display area 012, a plurality of second power sub-lines 62 (VDD2) and second data lines 72 (data2) located in the second display area 011, and first data lines 71 (data1) passing through the first display area 012 and the second display area 011. At a boundary of the first display area 012 and the second display area 011, the first data line 71 (data1) has corners. In the first display area 012, portions of the third signal lines located between two adjacent pixels 4a (the pixel including three first sub-pixels 41) are converged relative to portions of the third signal lines located in a region where the pixel 4a is located. Such a design is conducive to increase the area of the opening 31a and improve the light transmittance of the display substrate 1A provided in the embodiments of the present disclosure. In the second display area 011, the third signal lines extend in the second direction D2. The third signal lines are parallel to one another, and portions of the third signal lines are not designed to be converged.

Figure 5H:
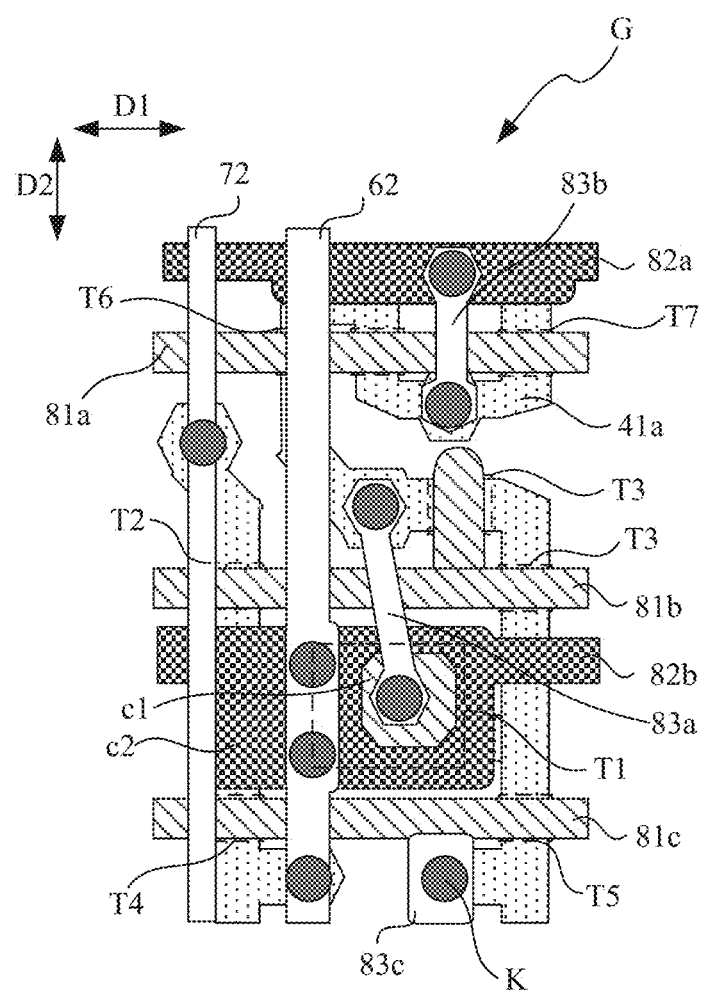
FIG. 5H is a diagram illustrating film layers of a sub-pixel in the film diagram shown in FIG. 5G.

As shown in FIG. 5H, FIG. 5H is a schematic diagram showing a layer positional relationship of the active semiconductor layer 41a, the first conductive layer 81, the second conductive layer 82 and the third conductive layer 83. For example, FIG. 5H illustrates a structural diagram of a pixel driving circuit of a sub-pixel 42 in the second display area 011 (e.g., corresponding to the region G in FIG. 5G), and the pixel driving circuit may also be referred to FIG. 8.

In some embodiments, as shown in FIG. 5H, the second data line 72 (data2) is connected to the source region, in the active semiconductor layer 41a, of the data writing transistor T2 through at least one via hole K in insulating layers between the third conductive layer 83 and the active semiconductor layer 41a. The second power sub-line 62 (VDD2) is connected to the source region, in the active semiconductor layer 41a, of the corresponding first light emission control transistor T4 through at least one via hole K in the insulating layers between the third conductive layer 83 and the active semiconductor layer 41a. The second power sub-line 62 (VDD2) is connected to the second electrode plate c2, in the second conductive layer 82, of the storage capacitor Cst through at least one via hole K in an insulating layer between the third conductive layer 83 and the second conductive layer 82. The second power sub-line 62 (VDD2) is also connected to the voltage signal line 82b (VD) in the second conductive layer 82 through at least one via hole K in the insulating layer between the third conductive layer 83 and the second conductive layer 82.

In some embodiments, as shown in FIG. 5H, the third conductive layer 83 further includes a first connection portion 83a, a second connection portion 83b and a third connection portion 83c. One end of the first connection portion 83a is connected to the drain region, in the active semiconductor layer 41a, of the corresponding threshold compensation transistor T3 through at least one via hole K in the insulating layers between the third conductive layer 83 and the active semiconductor layer 41a, and the other end of the first connection portion 83a is connected to the gate (i.e., the first electrode plate c1 of the storage capacitor Cst), in the first conductive layer 81, of the driving transistor T1 through at least one via hole K in insulating layers between the third conductive layer 83 and the first conductive layer 81. One end of the second connection portion 83b is connected to the initialization signal line 82a (vinit) through one via hole K in the insulating layer between the third conductive layer 83 and the second conductive layer 82, and the other end of the second connection portion 83b is connected to the drain region, in the active semiconductor layer 41a, of the second reset transistor T7 through at least one via hole K in the insulating layers between the third conductive layer 83 and the active semiconductor layer 41a. The third connection portion 83c is connected to the drain region, in the active semiconductor layer 41a, of the second light emission control transistor T5 through at least one via hole K in the insulating layers between the third conductive layer 83 and the active semiconductor layer 41a.

It will be noted that structures of the pixel driving circuits 21 in the first sub-pixel 41 and the second sub-pixel 42 are not limited. The above is only an example of a connection relationship of the transistors and the storage capacitor of the pixel driving circuit 21 in the second sub-pixel 42. A connection relationship of the transistors and the storage capacitor of the pixel driving circuit 21 in the first sub-pixel 41 may be referred to the above description, but is not limited thereto.

In some embodiments, as shown in FIGS. 9A and 9B, in the first display area 012, each first sub-pixel 41 includes one light-emitting device 22. For example, as shown in FIG. 2, in the case where the first light-shielding layer 31 has the plurality of openings 31a arranged in an array, the plurality of first sub-pixels 41 are grouped in a way that three first sub-pixels 41 are in one group to form a plurality of pixels 4a arranged in an array, and one pixel 4a is provided among every four openings 31a, the light-emitting devices 22 of the three sub-pixels 41 included in one pixel 4a are configured to emit blue light, red light, and green light, respectively.

In the second display area 011, each second sub-pixel 42 includes one light-emitting device, and a plurality of light-emitting devices in the second display area 011 are configured to emit blue light, red light and green light.

In some embodiments, as shown in FIG. 9A, in a case where the first power sub-line 52 is a single layer, a layer where the first power sub-line 52 and the source and the drain of the thin film transistor are located is referred to as a first source-drain layer (also called SD1 layer). As shown in FIG. 9B, in a case where the first power sub-line 52 is a double layer (including the third sub-layer and the fourth sub-layer), a layer where the third sub-layer of the first power sub-line 52 and the source and the drain of the thin film transistor are located is referred to as a first source-drain layer (also called SD1 layer), and a layer where the fourth sub-layer of the first power sub-line 52 is located is referred to as a second source-drain layer (also called SD2 layer). The display substrate 1A further includes a planarization layer 24 disposed between the thin film transistor TFT and the light-emitting device 22, and a pixel defining layer 25 disposed on a side of the planarization layer 24 away from the base substrate 1. As shown in FIG. 9A, the planarization layer 24 is disposed at a side of the first source-drain layer away from the base substrate 1, and the planarization layer 24 has via holes extending through the planarization layer 24 to realize an electrical connection between the thin film transistor and the light-emitting device 22. A plurality of openings are arranged in the pixel defining layer 25, and the plurality of openings are used for arranging the plurality of light-emitting devices 22 to define a size of a light-emitting region.

For example, the light-emitting device 22 includes an anode 221, a cathode 223, and a light-emitting layer 222 disposed between the anode 221 and the cathode 223. A relative positional relationship between the anode 221 and the cathode 223 in the embodiments of the present disclosure includes, but is not limited to, the following two situations.

In a first situation, as shown in FIGS. 9A and 9B, the cathode 223 is farther away from the base substrate 1 than the anode 221. That is, in a case where the base substrate 1 is placed horizontally, in the direction that is perpendicular to the base substrate 1 and from a side close to the base substrate 1 pointing to another side away from the base substrate 1, the cathode 223 is in an upper layer and the anode 221 is in a lower layer. The source 216 of the thin film transistor TFT is electrically connected to the anode 221 through a via hole extending through the planarization layer 24.

In a second situation, the cathode is closer to the base substrate than the anode. That is, in a case where the base substrate is placed horizontally, in the direction that is perpendicular to the base substrate 1 and from a side close to the base substrate pointing to another side away from the base substrate 1, the cathode is in the lower layer and the anode is in the upper layer.

In some examples, as shown in FIGS. 9A and 9B, the display substrate 1A further includes an encapsulation layer 26 disposed on a side of the light-emitting devices 22 away from the base substrate 1. For example, the encapsulation layer 26 includes a first inorganic encapsulation layer 261, an organic encapsulation layer 262 and a second inorganic encapsulation layer 263. The first inorganic encapsulation layer 261 is disposed on a side of the cathode 223 away from the base substrate 1, the organic encapsulation layer 262 is disposed on a side of the first inorganic encapsulation layer 261 away from the base substrate 1, and the second inorganic encapsulation layer 263 is disposed on a side of the organic encapsulation layer 262 away from the base substrate 1.

Figure 12:
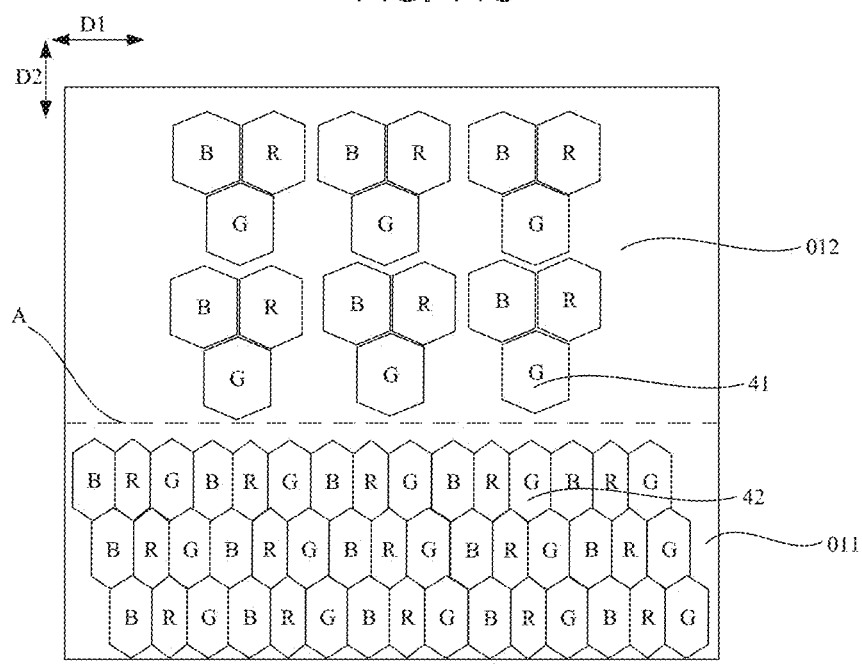
FIG. 12 is a schematic diagram illustrating an arrangement of sub-pixels, in accordance with some embodiments of the present disclosure.
Figure 13:
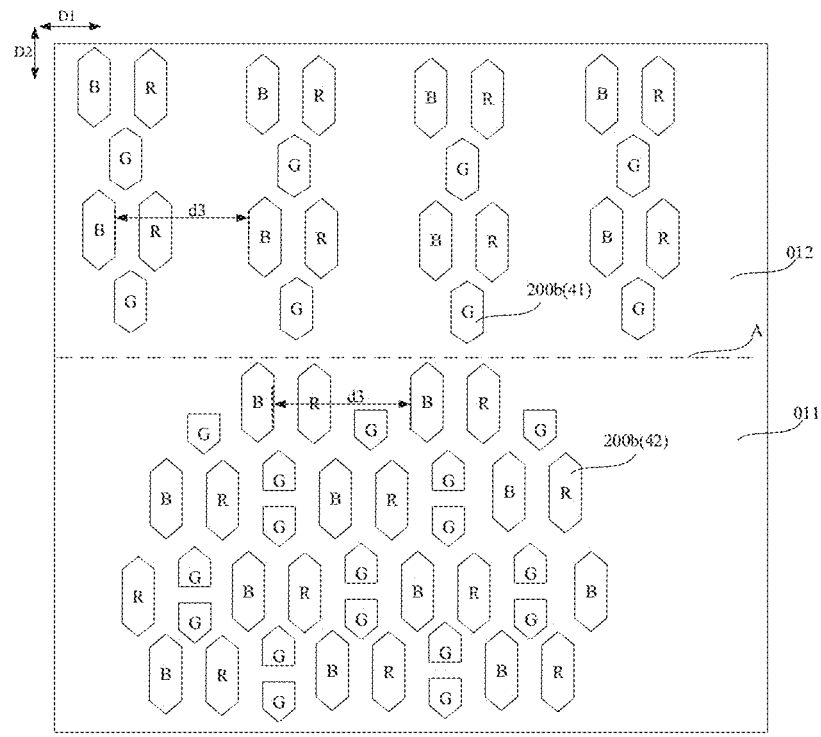
FIG. 13 is a schematic diagram illustrating an arrangement of sub-pixel openings, in accordance with some embodiments of the present disclosure.

In some embodiments, referring to FIGS. 12 and 13, a top view of the display substrate 1A is simplified, and only arrangements of the plurality of first sub-pixels 41 and the plurality of second sub-pixels 42 are illustrated. It can be understood in a way that, an arrangement of the plurality of first sub-pixels 41 and the plurality of second sub-pixels 42 in the display substrate 1A shown in FIG. 2 is illustrated on a basis of a layout of the pixel driving circuits 21 included in the sub-pixels, and arrangements of the plurality of first sub-pixels 41 and the plurality of second sub-pixels 42 in the display substrate 1A shown in FIGS. 12 and 13 are illustrated on a basis of an arrangement of the light-emitting devices (light-emitting regions of the light-emitting devices) included in the sub-pixels. FIG. 2 can be compared with FIGS. 12 and 13.

As shown in FIG. 12, in some sub-pixels for emitting light with the same color, an area of each first sub-pixel 41 in the first display area 012 is greater than an area of each second sub-pixel 42 in the second display area 011. It will be noted that the area of each first sub-pixel 41 and the area of each second sub-pixel 42 described here refer to an area of the light-emitting region of the light-emitting device 22 included in the sub-pixel. Areas of orthogonal projections of the pixel driving circuit 21 in the first sub-pixel 41 and the pixel driving circuit 21 in each second sub-pixel 42 on the base substrate 1 are the same.

For example, in some sub-pixels for emitting red light, the area of each first sub-pixel 41 in the first display area 012 is greater than the area of each second sub-pixel 42 in the second display area 011. In some sub-pixels for emitting green light, the area of each first sub-pixel 41 in the first display area 012 is greater than the area of each second sub-pixel 42 in the second display area 011. In some sub-pixels for emitting blue light, the area of each first sub-pixel 41 in the first display area 012 is greater than the area of each second sub-pixel 42 in the second display area 011.

In the display substrate 1A provided in the embodiments of the present disclosure, since the distribution density of the first sub-pixels 41 in the first display area 012 is less than the distribution density of the second sub-pixels 42 in the second display area 011, the first display area 012 provides space for the plurality of first sub-pixels 41 and signal lines (e.g., the first power sub-lines 52, the first data lines 71, the gate lines, etc.), and a large amount of space may also be reserved. The reserved space corresponds to the plurality of openings 31a of the first light-shielding layer 31. The reserved space may be used to transmit light (e.g., infrared light), so that the first display area 012 may not only display images normally, but also transmit light, thereby avoiding providing a hole for installing the front optical component 300 in the display substrate 1A, and realizing a full-screen display. In addition, since in some sub-pixels for emitting light with the same color, the area of the first sub-pixel 41 in the first display area 012 is greater than the area of the second sub-pixel 42 in the second display area 011, a low luminous intensity caused by a decrease in the pixel distribution density of the first sub-pixels 41 in the first display area 012 may be compensated to reduce a brightness difference between the first display area 012 and the second display area 011.

In some embodiments, a shape of each sub-pixel of the sub-pixels may be a rectangle, a diamond or other polygons, and of course, it may also be other regular patterns, which will not be listed herein.

It can be understood that, as shown in FIG. 13, each sub-pixel has at least one sub-pixel opening 200b corresponding to the pixel defining layer 25. For example, the second sub-pixel 42 and the first sub-pixel 41 that emit red light and blue light respectively have one sub-pixel opening 200b corresponding to the pixel defining layer 25, and the second sub-pixel 42 that emits green light has two sub-pixel openings 200b corresponding to the pixel defining layer 25.

In some embodiments, a distance d3 between sub-pixel openings 200b of any two adjacent sub-pixels that emit light with a same color in the first direction D1 is equal.

Referring to FIG. 13, by taking the sub-pixel opening 200b of the first sub-pixel 41 that emits blue light and the sub-pixel opening 200b of the second sub-pixel 42 that emits blue light as an example, meanings of the sentence that "the distance d3 between sub-pixel openings 200b of any two adjacent sub-pixels that emit light with the same color in the first direction D1 is equal" is explained, and includes three meanings.

First, a distance d3, in the first direction D1, between sub-pixel openings 200b of any two adjacent first sub-pixels 41 that emit blue light B is equal.

Second, a distance d3, in the first direction D1, between sub-pixel openings 200b of any two adjacent second sub-pixels 42 that emit blue light B is equal.

Third, the distance d3, in the first direction D1, between sub-pixel openings 200b of any two adjacent second sub-pixels 42 that emit blue light B is equal to the distance d3, in the first direction D1, between sub-pixel openings 200b of any two adjacent first sub-pixels 41 that emit blue light B.

In this way, when an organic electroluminescent material for emitting light with a certain color (e.g., blue) is formed in the pixel defining layer 25 of the display substrate 1A to form a light-emitting layer 222, the organic electroluminescent material is not easily formed in a wrong sub-pixel opening, thereby improving a problem of color mixing.

It will be explained that, as can be seen from the above description of the light-emitting device 22, the light-emitting device 22 includes the anode 221, the light-emitting layer 222 and the cathode 223. The pixel defining layer 25 is disposed on a side of the anode 221 away from the base substrate 1 and has a sub-pixel opening overlapped with the anode 221. The organic electroluminescent material is formed in the sub-pixel opening of the display substrate 1A to form the light-emitting layer 222. Since a distance d3, in the first direction D1, between any two adjacent sub-pixel openings that emit light with a same color is equal, when the light-emitting layer 222 is formed, the organic electroluminescent material is not easily formed in a wrong pixel opening, thereby improving the problem of color mixing.

Referring to FIGS. 12 and 13, it can be understood that the second display area 011 and the first display area 012 have a first boundary A (dotted line A).

In the first display area 012, each first sub-pixel 41 closest to the first boundary A is used to emit light of a first color, e.g., green light.

As shown in FIG. 13, in the second display area 011, the number of sub-pixel openings 200b of each second sub-pixel 42 for emitting the light of the first color (e.g., green light) that is closest to the first boundary A is less than the number of sub-pixel openings 200b of each second sub-pixel 42 of other second sub-pixels 42 for emitting the light of the first color (e.g., green light). In this way, a light color difference near the first boundary A may be reduced.

For example, as shown in FIG. 13, in the first display area 012, each first sub-pixel 41 closest to the first boundary A is used to emit green light. In the second display area 011, the number of sub-pixel openings 200b of each sub-pixel 200 for emitting green light that is closest to the first boundary A is one. In the second display area 011, the number of sub-pixel openings 200b of each second sub-pixel 42 of other second sub-pixels 42 for emitting green light is two. In this way, the light color difference near the first boundary A may be reduced.

As shown in FIG. 68, the display apparatus 3A provided in embodiments of the present disclosure further includes a cover plate 9 disposed on a side of the display layer 2 of the display substrate 1A away from the base substrate 1.

The front optical component 300 is disposed on a side of the display substrate 1A away from the display surface 01a thereof (i.e., a back surface of the display substrate 1A), and the orthogonal projection of the front optical component 300 on the display substrate 1A is located in the first display area 012.

It will be explained here that although the front optical component 300 is disposed on the back surface of the display substrate 1A, its corresponding receiving surface faces the display surface 01a of the display substrate 1A to realize its front function.

In a case where the front optical component 300 includes a front camera unit, the receiving surface is a lens of the front camera unit; in a case where the front optical component 300 includes an infrared sensor unit, the receiving surface is a sensing surface of the infrared sensor unit.

The front optical component 300 may include a front camera unit, and of course, it may also include the infrared detection unit 300'.

The display apparatus 3A provided in the embodiments of the present disclosure has the same beneficial effects as the display substrate 1A provided in the embodiments of the present disclosure, which will not be repeated herein.

The display apparatus 3A provided in the embodiments of the present disclosure may be any apparatus that displays images whether in motion (e.g., videos) or fixed (e.g., still images), and regardless of literal or graphical. More specifically, it is contemplated that the embodiments may be implemented in or associated with a variety of electronic devices. The variety of electronic devices include, but are not limited to mobile phones, wireless devices, personal data assistants (PDAs), hand-held or portable computers, global positioning system (GPS) receivers/navigators, cameras, MPEG-4 Part 14 (MP4) video players, video cameras, game consoles, watches, clocks, calculators, TV monitors, flat panel displays, computer monitors, car displays (e.g., odometer displays, etc.), navigators, cockpit controllers and/or displays, displays of camera views (e.g., displays of rear view cameras in vehicles), electronic photographs, electronic billboards or signages, projectors, building structures, packagings, and aesthetic structures (e.g., displays for displaying images of a piece of jewelry), etc.

The above descriptions are merely specific implementations of the present disclosure, but the protection scope of the present disclosure is not limited thereto. Any changes or replacements those skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate having a display area and a peripheral area surrounding the display area, the display area including a first display area, the display substrate comprising:
    a base substrate;
    a first light-shielding layer disposed on a side of the base substrate, the first light-shielding layer being located at least in the first display area, and having a plurality of openings arranged in an array;
    a plurality of first sub-pixels disposed at a side of the first light-shielding layer away from the base substrate, the plurality of first sub-pixels being located in the first display area, and orthogonal projections of the plurality of first sub-pixels on the base substrate being non-overlapping with orthogonal projections of the openings on the base substrate; and
    a first power line including a first power bus and a plurality of first power sub-lines;
    at least one portion of the first power bus being located in a region of the peripheral area proximate to a side of the first display area, the plurality of first power sub-lines being located in the first display area and being electrically connected to the first power bus, the plurality of first power sub-lines being configured to provide first power signals to the plurality of first sub-pixels, and orthogonal projections of the plurality of first power sub-lines on the base substrate being non-overlapping with the orthogonal projections of the openings on the base substrate, wherein the first light-shielding layer is electrically connected to the first power line;
    the display substrate further comprising:
        at least one insulating film disposed between the first power line and the first light-shielding layer, and the at least one insulating film being provided with a plurality of via holes extending through the at least one insulating film, wherein the first power line is electrically connected to the first light-shielding layer through the plurality of via holes;
        the first power bus includes a first sub-layer and a second sub-layer, and the first sub-layer is electrically connected to the second sub-layer through a third via hole;
    wherein the first light-shielding layer is also located in the peripheral area, the plurality of via holes includes a plurality of first via holes located in the peripheral area, the first light-shielding layer is electrically connected to the first power bus through the plurality of first via holes; and the plurality of first via holes include at least two types of first via holes having different hole depths.

2. The display substrate according to claim 1, wherein the plurality of first via holes include at least one first via hole group, and each first via hole group includes at least one first via hole column;
    hole depths of first via holes in each first via hole column are different.

3. The display substrate according to claim 2, wherein there are a plurality of first via hole groups, and there are a plurality of first via hole columns in each first via hole group;
    the plurality of first via hole groups are arranged in a first direction; and
    the plurality of first via hole columns in each first via hole group are arranged in the first direction, and first via holes having a same hole depth in the plurality of first via hole columns are arranged in a row in the first direction.

4. The display substrate according to claim 2, wherein a surface of the first light-shielding layer away from the base substrate has depressions corresponding to at least part of the plurality of first via holes, and the depressions have at least two types of depths.

5. The display substrate according to claim 1, wherein the plurality of via holes further includes a plurality of second via holes located in the first display area, and the first light-shielding layer is electrically connected to at least part of the plurality of first power sub-lines through the plurality of second via holes.

6. The display substrate according to claim 5, wherein the plurality of second via holes are evenly distributed in the first display area.

7. The display substrate according to claim 6, wherein three first sub-pixels are provided at a position among every four openings of the first light-shielding layer and constitute one pixel, and one pixel corresponds to at least one second via hole.

8. The display substrate according to claim 1, wherein the at least one insulating film includes a first insulating layer located between the first light-shielding layer and the plurality of first sub-pixels, a first gate insulating layer, a second gate insulating layer and an interlayer insulating layer, wherein at least one first sub-pixel of the plurality of first sub-pixels includes thin film transistors and a storage capacitor;
    a thin film transistor includes:
        an active layer located on a side of the first insulating layer away from the base substrate, the first gate insulating layer being located on a side of the active layer away from the base substrate;
        a gate located on a side of the first gate insulating layer away from the base substrate, the second gate insulating layer being located on a side of the gate away from the base substrate, the interlayer insulating layer being located on a side of the second gate insulating layer away from the base substrate; and a source and a drain located on a side of the interlayer insulating layer away from the base substrate; and the storage capacitor includes a first electrode plate and a second electrode plate, the first electrode plate and the gate are located in a same layer, and the second electrode plate is located between the second gate insulating layer and the interlayer insulating layer.

9. The display substrate according to claim 8, wherein at least one first power sub-line of the plurality of first power sub-lines includes a third sub-layer and a fourth sub-layer, and the third sub-layer is electrically connected to the fourth sub-layer through a fourth via hole.

10. The display substrate according to claim 1, wherein the display area further includes a second display area located on a side of the first display area away from the first power bus;

the display substrate further comprises:

a plurality of second sub-pixels located in the second display area;

a second power line including a second power bus and a plurality of second power sub-lines, wherein at least one portion of the second power bus is located in a region of the peripheral area proximate to a side of the second display area, the plurality of second power sub-lines are located in the second display area and are electrically connected to the second power bus, and the plurality of second power sub-lines are configured to provide second power signals to the plurality of second sub-pixels.

11. The display substrate according to claim 10, wherein a distribution density of the plurality of second sub-pixels is greater than a distribution density of the plurality of first sub-pixels.

12. The display substrate according to claim 10, further comprising a second light-shielding layer disposed on a side of the base substrate, wherein the second light-shielding layer is located in the second display area, and the second light-shielding layer and the first light-shielding layer are located in a same layer; and the second light-shielding layer is electrically connected to the second power line.

13. The display substrate according to claim 10, wherein an area of each first sub-pixel in the first display area is greater than an area of each second sub-pixel in the second display area.

14. The display substrate according to claim 10, wherein in the first display area and the second display area, each sub-pixel has at least one sub-pixel opening, and a distance between sub-pixel openings of any two adjacent sub-pixels that emit light with a same color in a first direction is equal.

15. A display apparatus, comprising:

the display substrate according to claim 1; and a front optical component disposed on a side of the display substrate away from a display surface thereof, and an orthogonal projection of the front optical component on the display substrate is located in the first display area.

16. The display apparatus according to claim 15, wherein the front optical component includes an infrared detection unit.

* * * * *

UNITED STATES PATENT AND TRADEMARK OFFICE
CERTIFICATE OF CORRECTION

PATENT NO. : 12,127,457 B2  
APPLICATION NO. : 17/284815  
DATED : October 22, 2024  
INVENTOR(S) : Bo Wang and Fuqiang Li Page 1 of 1

It is certified that error appears in the above-identified patent and that said Letters Patent is hereby corrected as shown below:

In the Specification

Column 6, Line 56: "FIGS. 2, 3A and 38" should be "FIGS. 2, 3A and 3B"
Column 14, Line 41: "FIGS. 2, 3A and 38" should be "FIGS. 2, 3A and 3B"
Column 17, Line 14: "As shown in FIGS. 9A and 98" should be "As shown in FIGS. 9A and 9B"
Column 17, Line 36: "As shown in FIGS. 9A and 98" should be "As shown in FIGS. 9A and 9B"
Column 24, Line 41: "As shown in FIG. 68" should be "As shown in FIG. 6B"

Signed and Sealed this
Twenty-fifth Day of February, 2025

Coke Morgan Stewart
*Acting Director of the United States Patent and Trademark Office*